United States Patent
Murata

(10) Patent No.: US 7,106,768 B2
(45) Date of Patent: Sep. 12, 2006

(54) LASER LIGHT GENERATOR CONTROL CIRCUIT AND LASER LIGHT GENERATOR CONTROL METHOD

(75) Inventor: Hiroshi Murata, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 428 days.

(21) Appl. No.: 10/461,098

(22) Filed: Jun. 13, 2003

(65) Prior Publication Data

US 2004/0032890 A1 Feb. 19, 2004

(30) Foreign Application Priority Data

Jun. 14, 2002 (JP) .................................. P2002-174554

(51) Int. Cl.
 *H01S 3/00* (2006.01)

(52) U.S. Cl. .............................. 372/38.02; 372/29.021; 372/29.015; 372/38.07; 372/31; 359/152

(58) Field of Classification Search ............. 372/38.02, 372/38.07, 29.021, 29.015; 359/152
See application file for complete search history.

(56) References Cited

U.S. PATENT DOCUMENTS 5,978,393 A * 11/1999 Feldman et al. ............... 372/31

6,512,617 B1 * 1/2003 Tanji et al. ................... 398/137
2004/0165622 A1 * 8/2004 Lu ........................ 372/29.021

FOREIGN PATENT DOCUMENTS

JP       2001-197014       7/2001

* cited by examiner

*Primary Examiner*—Minsun Oh Harvey
*Assistant Examiner*—Dung Nguyen
(74) *Attorney, Agent, or Firm*—Fish & Richardson P.C.

(57) ABSTRACT

The laser light generator control circuit comprises a load section, a control section, a bias current circuit section, and a modulation current circuit section. The load section generates a monitor voltage $V_1$ that corresponds to the optical current corresponding to the amount of light received by a monitor light receiving element for receiving light from the laser light generator. The control section selects a combination (Db, Dm) in accordance with the result of comparing a value corresponding to the monitor voltage $V_1$, and a reference value, from a group of combinations $(Db, Dm)_n$ that comprises a plurality of combinations (Db, Dm) of a value Db that corresponds to the bias current and a value Dm that corresponds to the modulation current, these combinations being specified so that the light emission power and the extinction ratio are constant, and generates a first control signal $V_2$ and a second control signal $V_3$ on the basis of the selected combination (Db, Dm).

17 Claims, 12 Drawing Sheets

| ENTRY NUMBER | lb | lm |
|---|---|---|
| 0 | 17.8 | 39.0 |
| 1 | 17.2 | 38.3 |
| 2 | 16.5 | 37.9 |
| ... | ... | ... |
| 255 | 3.2 | 26.4 |

LASER LIGHT GENERATOR CONTROL CIRCUIT AND LASER LIGHT GENERATOR CONTROL METHOD

BACKGROUND OF THE INVENTION

1. Field of the Invention

The present invention relates to a laser light generator control circuit and to a method for controlling a laser diode.

2. Related Background Art

Optical transmitters comprise a semiconductor laser and a laser drive circuit. In the field of optical communications, a semiconductor laser is driven by a laser drive circuit and generates signal light that corresponds to a transmission signal.

SUMMARY OF THE INVENTION

The present inventors have been involved in research relating to the control of semiconductor lasers. In this research, the present inventors conducted experiments with regard to semiconductor laser control methods. These experiments revealed the following.

A first technique included a technique for controlling the optical output power and extinction ratio of a semiconductor laser by detecting the average value and the peak value of the output of a monitor light-receiving element. However, it became evident from the experiments of the present inventors that when the transmission rate of the optical signal rises, it is difficult to rapidly operate the monitor light receiving element to an extent permitting detection of the peak value in the received optical signal.

A second technique involves the control circuit converting the output of the monitor light receiving element into a digital value by means of an A/D converter and subtracting this digital value from a reference value stored in memory. The control circuit then converts the value produced by this subtraction into an analog value by means of a D/A converter and controls the semiconductor laser on the basis of this analog value. In this control technique, optimum modulation current values with respect to temperature are stored in memory with the intention of making constant the extinction ratio on the basis of these values. With this technique, in order to provide this control, a modulation current value is determined uniquely by means of a signal from a thermistor for sensing the ambient temperature, and a bias current is determined so that the average power is kept constant. However, it became evident from the experiments of the present inventors that, with this technique, operation is such that, when the luminous efficiency drops as a result of deterioration of the laser light generator, only the bias current increases. In consequence, the extinction ratio does not remain constant.

According to a third technique, a bias current, a modulation current, and a value for the output from the monitor light receiving element at the start of usage are stored in memory with respect to the ambient temperature. Deterioration is detected on the basis of the result of comparing the signal from the monitor light receiving element in a case where this bias current and modulation current are provided, and the initial output value which is stored in memory, whereby the modulation current and the bias current are corrected. However, according to the experiments of the present inventors, with this technique, it is fundamentally necessary to measure the temperature at a point close to the semiconductor laser, and the installation of a temperature sensor at a point close to the semiconductor laser represents an obstacle in a case of miniaturizing a laser light emitting section that comprises a laser diode, a monitor light receiving element and an optical system.

With these experiments, the discovery was made that technical problems exist in conventional techniques for controlling the optical output power of the semiconductor laser so that this power approaches a predetermined value and for controlling the extinction ratio of the semiconductor laser so that this ratio approaches a predetermined value.

It is accordingly an object of the present invention to provide a laser light generator control circuit for performing control with respect to the optical output power and extinction ratio of a laser light generator that comprises a semiconductor light emitting element, and to provide a method for controlling a laser diode.

One aspect of the present invention relates to a laser light generator control circuit for controlling a laser light generator that emits laser light when supplied with a bias current and modulation current. The laser light generator control circuit comprises a load section, a control section, a bias current circuit section, and a modulation current circuit section. The load section generates a signal that corresponds to an optical current generated by a light receiving element in accordance with the amount of light received from the laser light generator.

The control section operates so as to select a combination (Db, Dm) in accordance with the result of comparing a value corresponding to the signal, and a reference value, from a group of combinations $(Db, Dm)_n$ (where n is an integer of two or more) that comprises a plurality of combinations (Db, Dm) of a value Db that corresponds to the bias current and a value Dm that corresponds to the modulation current, these combinations being specified so that the light emission power exhibits a predetermined dependence and the extinction ratio exhibits a predetermined dependence. Further, a first control value and a second control value are generated on the basis of the selected combination (Db, Dm), and a first control signal for changing the bias current supplied to the laser light generator is generated on the basis of the first control value and a second control signal for changing the modulation current supplied to the laser light generator is generated on the basis of the second control value in the control section.

The bias current circuit section is connected to the laser light generator and generates a bias current in accordance with the first control signal. The modulation current circuit section is connected to the laser light generator and generates a modulation current in accordance with the second control signal.

This control circuit selects a combination (Db, Dm) from the group of combinations $(Db, Dm)_n$ in order to control the bias current and the modulation current, and hence a control circuit permitting control such that the light emission power exhibits a predetermined dependence and the extinction ratio exhibits a predetermined dependence is provided.

Further, because a group of combinations whereby the light emission power exhibits a predetermined dependence and the extinction ratio exhibits a predetermined dependence can be set for individual laser light generators, a control circuit suited to individual differences between laser light generators can be provided.

The laser light generator control circuit is capable of specifying the combinations of the group of combinations $(Db, Dm)_n$ so that the light emission power is constant and the extinction ratio is constant. A control circuit for keeping the light emission power and the extinction ratio constant is thus implemented.

In the laser light generator control circuit, the control section may comprise first storing means, comparing means, first selecting means, and second selecting means. The first storing means store the group of combinations $(Db, Dm)_n$ and the reference value. The comparing means operate so as to compare a monitor signal corresponding to the optical current value with the reference value. The first selecting means operate so as to select a combination (Db, Dm) set to bring about an increase in the light amount, from the group of combinations $(Db, Dm)_n$ stored in the first storing means, in a case where the result of the comparison by the comparing means indicates that the light amount is smaller than a predetermined value, and to set Db in this combination as the first control value and Dm in this combination as the second control value. The second selecting means operate so as to select a combination (Db, Dm) set to bring about a reduction in the light amount, from the group of combinations $(Db, Dm)_n$ stored in the first storing means, in a case where the result of the comparison indicates that the light amount is greater than a predetermined value and to set Db in this combination as the first control value and Dm in this combination as the second control value. The implementation of this constitution is comparatively straightforward.

Further, in the laser light generator control circuit, the control section may comprise first storing means, comparing means, third selecting means, and fourth selecting means.

The third selecting means operate so as to select a plurality of combinations that comprises a combination for increasing the light amount, from the group of combinations $(Db, Dm)_n$ stored in the first storing means in a case where the result of the comparison by the comparing means indicates that the light amount is smaller than a predetermined value, generate an interpolation value $Db_p$ between a plurality of Db values in the plurality of combinations and set this interpolation value $Db_p$ as the first control value, and generate an interpolation value $Dm_p$ between a plurality of Dm values in the plurality of combinations and set this interpolation value $Dm_p$ as the second control value.

Further, the fourth selecting means operate so as to select a plurality of combinations that comprises a combination for reducing the light amount, from the group of combinations $(Db, Dm)_n$ stored in the first storing means in a case where the result of the comparison by the comparing means indicates that the light amount is greater than a predetermined value, generate an interpolation value $Db_p$ between a plurality of Db values in the plurality of combinations and set this interpolation value $Db_p$ a first control value, and generate an interpolation value $Dm_p$ between a plurality of Dm values in the plurality of combinations and set this interpolation value $Dm_p$ as the second control value.

Therefore, the bias current and the modulation current supplied to the laser light generator can also be precisely controlled at a magnitude smaller than that corresponds to the interval between the combinations in the group of combinations $(Db, Dm)_n$, and control whereby the light emission power and extinction ratio are made to approach predetermined characteristics is possible even in a group of combinations in which the number n is small, whereby high-precision power control is possible.

The laser light generator control circuit can comprise second storing means for storing information corresponding to the generated first control value and information corresponding to the generated second control value. This constitution is easy to implement and the selection and so forth of the above-described combinations that afford an increase or reduction in the light amount can be suitably performed by means of the information stored in the second storing means.

A nonvolatile memory can be adopted as the first storing means of the laser light generator control circuit. In such a case, when the power supply of the control circuit is turned on, the control circuit can be made to operate without settings being administered from the outside, on the basis of the group and reference value and the like stored in the nonvolatile memory.

In the laser light generator control circuit, the control section can comprise an A/D conversion circuit section for receiving the signal and generating a digital value corresponding to the signal; a first D/A conversion circuit section for generating an analog value corresponding to the first control value and setting this value as the first control signal; and a second D/A conversion circuit section for generating an analog value corresponding to the second control value and setting this value as the second control signal.

Thus, when processing in the control section is executed by means of digital control, control that inhibits the influence of variations in temperature and supply voltage is possible. Moreover, complex control can be performed accurately.

In the laser light generator control circuit, the control section can comprise fourth means for maintaining the first control signal and the second control signal in a case where an absolute value for the difference between a value corresponding to the signal, and a reference value is equal to or less than a threshold value. It is accordingly possible to prevent a slight staggering of the bias current and the modulation current, whereby current can be supplied stably to the laser light generator.

In the laser light generator control circuit, the control section can comprise fifth means for generating the first and second control signals such that, in either a case where the result of comparing the first control value and the bias current threshold value indicates an excessive bias current, or a case where the result of comparing the second control value and the modulation current threshold value indicates an excessive modulation current, the bias current and the modulation current supplied to the laser light generator are not increased, whereby the supply of an overcurrent to the laser light generator is prevented. Further, in the laser light generator, even when the environment temporarily deviates from the specified range, the light emission power and extinction ratio can be controlled so as to exhibit a predetermined dependence from the point when the environment returns to within the specified range.

In the laser light generator control circuit, the control section can comprise sixth means for generating the first and second control signals such that, in either a case where the result of comparing the first control value and the bias current threshold value indicates an excessively small bias current, or a case where the result of comparing the second control value and the modulation current threshold value indicates an excessively small modulation current, the bias current and the modulation current supplied to the laser light generator are not reduced. Therefore, in the laser light generator, even when the environment temporarily deviates from the specified range, the light emission power and extinction ratio can be controlled so as to exhibit a predetermined dependence from the point when the environment returns to within the specified range.

In the laser light generator control circuit, the control section can further comprise initial value setting means for starting the laser light generator control circuit by sequentially selecting a combination (Db, Dm) for increasing the bias current and the modulation current from the group of combinations (Db, Dm)$_n$. Accordingly, a transient overcurrent can be prevented from flowing to the laser light generator when operation of the laser light generator is started.

In the laser light generator control circuit, the control section can comprise: means for comparing any one of the first control value, the second control value, and the sum of the first control value and the second control value, with a threshold value, and generating a first comparison signal that indicates the comparison result; and means for generating, in a case where the first comparison signal indicates an overcurrent, a first warning signal indicating an overcurrent of the laser light generator. Accordingly, the supply of an overcurrent can be detected, and deterioration and breakdown of the laser light generator can be detected. Further, the control section can comprise means for interrupting the first warning signal when the first comparison signal indicates a normal current, in a case where the first warning signal is generated. The warning signal can therefore be canceled when the current has become normal. Further, the warning output can be stabilized by allowing the threshold value to exhibit hysteresis.

In the laser light generator control circuit, the control section can comprise: means for comparing a monitor signal that corresponds to the optical current with a threshold value and generating a third comparison signal that indicates the comparison result; and means for generating a second warning signal that indicates a drop in the light emission power of the laser light generator, in a case where the third comparison signal indicates a power shortage. Deterioration and breakdown of the laser light generator can therefore be detected from outside. Further, the control section can comprise means for interrupting the second warning signal when the third comparison signal indicates normal power, in a case where the second warning signal is generated. The warning signal can therefore be canceled when the power has become normal. Further, the warning output can be stabilized by allowing the threshold value to exhibit hysteresis.

Usage of both the first comparison signal and the third comparison signal permits a distinction between a deterioration state for a case where a predetermined optical power is generated but there is a large amount of supply current, and a breakdown state for a case where light is not emitted, for example. It is thus possible to exchange the optical module in advance of a breakdown in order to avoid an unexpected shutdown of the system.

Also, the laser light generator control circuit can further comprise an interface section for communicating with an external device, and means connected to the interface section and for writing to nonvolatile memory. According to this constitution, adjustment of the laser light generator control circuit can be undertaken via the interface section. For example, by providing the interface section, labor can be alleviated in comparison with manual adjustment in individual adjustment work processes required for the laser diode drive circuit. Further, in cases where characteristic data such as the group of combinations (Db, Dm)$_n$ of individual laser diodes is housed in an external device such as a computer, adjustments can be made easily by means of characteristic data.

The laser light generator control circuit can further comprise: an interface section for communicating with an external device; means for interrupting the light generation of the laser light generator by providing a response to a signal from the interface section; and means for starting the light generation of the laser light generator by providing a response to a signal from the interface section. These means make it possible to avoid a hazard resulting from leakage of laser light by interrupting the optical output upon detection of a disconnection of the optical connector, for example. Further, because the optical output can be intentionally interrupted and started, it is possible to confirm optical fiber continuity, for example.

The laser light generator control circuit can comprise: a laser light generator comprising a semiconductor light emitting element; and a monitor light receiving element disposed so as to receive light from the laser light generator and for generating an optical current that corresponds to the amount of light received.

Another aspect of the present invention relates to a method for controlling a laser diode. This method is a laser light generator control method for controlling a laser light generator that emits laser light when supplied with a bias current and modulation current, comprising: (a) a generating step of generating a signal that corresponds to an optical current generated by a light receiving element in accordance with the amount of light received from the laser light generator; (b) a control signal generating step of selecting a combination (Db, Dm) in accordance with the result of comparing a value corresponding to the signal, and a reference value, from a group of combinations (Db, Dm)$_n$ (where n is an integer of two or more) that comprises a plurality of combinations (Db, Dm) of a value Db that corresponds to the bias current and a value Dm that corresponds to the modulation current, these combinations being specified so that the light emission power exhibits a predetermined dependence and the extinction ratio exhibits a predetermined dependence; generating a first control value and a second control value on the basis of the selected combination (Db, Dm); and (c) generating a first control signal for controlling the bias current supplied to the laser light generator on the basis of the first control value, and generating a second control signal for controlling the modulation current supplied to the laser light generator on the basis of the second control value; and a driving step of generating, in accordance with the first control signal, the bias current supplied to the laser light generator, and generating, in accordance with the second control signal, the modulation current supplied to the laser light generator.

According to this method, because a combination (Db, Dm) is selected from the group of combinations (Db, Dm)$_n$ of the value Db that corresponds to the bias current and the value Dm that corresponds to the modulation current in order to control the bias current and the modulation current, a control method permitting control such that the light emission power exhibits a predetermined dependence and the extinction ratio exhibits a predetermined dependence can be provided.

Further, because a group of combinations whereby the light emission power exhibits a predetermined dependence and the extinction ratio exhibits a predetermined dependence can be set for individual laser light generators, a control method suited to individual differences between laser light generators can be provided.

In this method for controlling a laser diode, the control signal generating step (b) may comprise: a comparing step for comparing a monitor signal corresponding to the optical current value from the light receiving element, with the reference value; and a selecting step for selecting a combination (Db, Dm) for increasing the light amount, from the group of combinations (Db, Dm)$_n$, in a case where the result of the comparison by the comparing means indicates that the light amount is smaller than a predetermined value, and setting Db in this combination as the first control value and Dm in this combination as the second control value; but selecting a combination (Db, Dm) for reducing the light amount, from the group of combinations (Db, Dm)$_n$, in a case where the result of the comparison indicates that the light amount is greater than a predetermined value, and setting Db in this combination as the first control value and Dm in this combination as the second control value. The implementation of this constitution is comparatively straightforward.

Furthermore, the control signal generating step (b) may comprise: a comparing step for comparing a monitor signal corresponding to the optical current value from the light receiving element, with the reference value; and a selecting step for selecting a plurality of combinations that comprises a combination for increasing the light amount, from the group of combinations (Db, Dm)$_n$ in a case where the result of the comparison by the comparing means indicates that the light amount is smaller than a predetermined value, generating an interpolation value Db$_p$ between a plurality of Db values in the selected plurality of combinations and setting this interpolation value Db$_p$ as the first control value, and generating an interpolation value Dm$_p$ between a plurality of Dm values in the selected plurality of combinations and setting this interpolation value Dm$_p$ as the second control value; but selecting a plurality of combinations that comprises a combination for reducing the light amount, from the group of combinations (Db, Dm)$_n$, in a case where the result of the comparison by the comparing means indicates that the light amount is greater than a predetermined value, generating an interpolation value Db$_p$ between a plurality of Db values in the selected plurality of combinations and setting this interpolation value Db$_p$ as the first control value, and generating an interpolation value Dm$_p$ between a plurality of Dm values in the selected plurality of combinations and setting this interpolation value Dm$_p$ as the second control value.

Therefore, the bias current and the modulation current supplied to the laser light generator can also be precisely controlled at a magnitude smaller than that corresponds to the interval between the combinations in the group of combinations (Db, Dm)$_n$ and control whereby the light emission power and extinction ratio are made to approach predetermined characteristics is possible in a group of combinations in which the number n is small, whereby high-precision power control is possible.

The abovementioned object of the present invention as well as other objects, characteristics and advantages will be easily apparent from the following detailed description of preferred embodiments of the present invention which will be provided with reference to the attached drawings.

DESCRIPTION OF THE PREFERRED EMBODIMENTS

Figure 1:
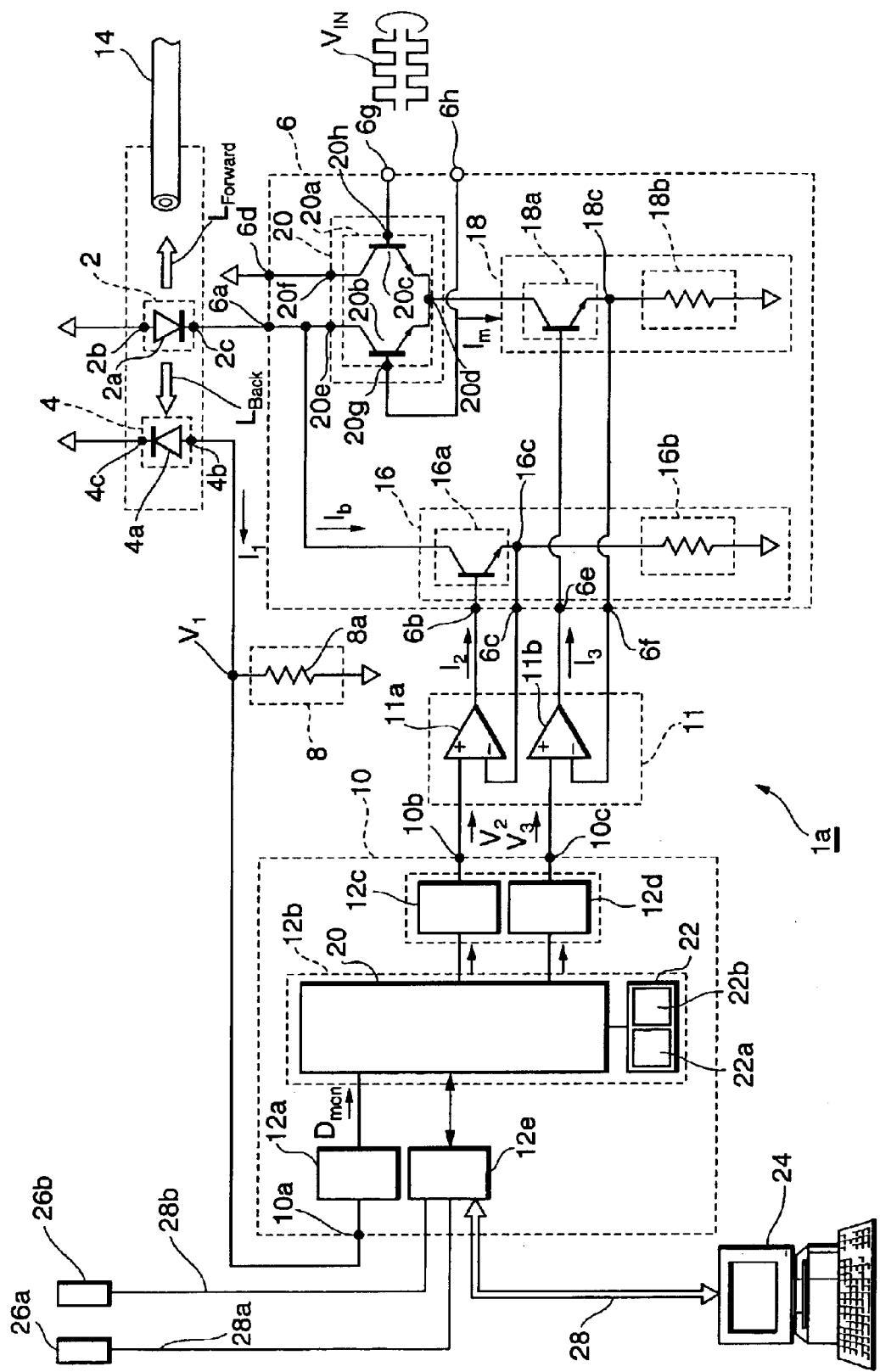
FIG. 1 is a block diagram showing the laser light generator control circuit according to an embodiment of the present invention.

The present invention can be understood easily through consideration of the attached drawings and the following detailed description. Where possible, the same reference numerals are employed in the drawings in order to indicate the same common elements.

(First Embodiment)

FIG. 1 is a block diagram showing the laser light generator control circuit according to an embodiment of the present invention. The laser light generator control circuit 1a comprises a drive circuit 6, a load section 8, a control section 10, and a bias current and modulation current control circuit 11.

Further, the laser light generator control circuit 1a can further comprise a laser light generator 2 and a monitor light receiving element 4. The laser light generator 2 comprises a semiconductor light emitting element such as a semiconductor laser element 2a. The semiconductor laser element 2a comprises an anode 2b and a cathode 2c. Further, the semiconductor laser element 2a comprises a first end face and a second end face, the first end face and second end face forming an optical resonator. The laser light generator 2 is optically coupled to an optical waveguide 14 such as an optical fiber, and light L$_{Forward}$ from the laser light generator 2 is supplied to the optical waveguide 14. The monitor light receiving element 4 is optically coupled to the laser light generator 2. Although this element is disposed so as to receive light L$_{Back}$ from the laser light generator 2, another arrangement is possible, and this element may be disposed so as to receive a portion of the light L$_{Forward}$. Also, the monitor light receiving element 4 generates an optical current $I_1$ that corresponds to the received light amount of the light from the laser light generator 2. For example, the monitor light receiving element 4 comprises a semiconductor light receiving element such as a photodiode 4a. The photodiode 4a comprises an anode 4b and a cathode 4c.

The load section 8 is connected to the monitor light receiving element 4 and generates a load voltage $V_1$ that corresponds with the optical current $I_1$. The load section 8 also comprises a resistive element 8a such as a resistor. The control section 10 receives the load voltage $V_1$ via an input 10a and operates so as to generate a first control signal $V_2$ for varying the bias current Ib and a second control signal $V_3$ for varying the modulation current Im in response to this voltage.

The control section 10 comprises an A/D conversion circuit section 12a, controlling means 12b, a first D/A conversion circuit section 12c, a second D/A conversion circuit section 12d, and an interface section 12e. The A/D conversion circuit section 12a comprises an A/D converter for receiving the load voltage $V_1$ via the input 10a and generating a digital value $D_{mon}$ that corresponds to the load voltage $V_1$.

The controlling means 12b comprise means for implementing the group of combinations $(Db, Dm)_n$ (where n is an integer of two or more) that comprises a plurality of combinations (Db, Dm) of a digital value Db that corresponds to the bias current and a digital value Dm that corresponds to the modulation current, these combinations being specified so that the light emission power exhibits a predetermined dependence and the extinction ratio exhibits a predetermined dependence; selecting a combination (Db, Dm) in accordance with the result of comparing a value corresponding to the digital value $D_{mon}$ and a reference value, from this group; and generating a first control value $D_1$ and a second control value $D_2$ on the basis of the combination.

According to the present embodiment, the first D/A conversion circuit section 12c generates the first control signal $V_2$ (analog value) on the basis of a first control value $D_1$. The second D/A conversion circuit section 12d generates the second control signal $V_3$ (analog value) on the basis of a second control value $D_2$. When processing in the control section is executed by means of digital control, control that inhibits the influence of variations in temperature and supply voltage is possible. Further, complex control can be performed accurately.

This laser light generator control circuit 1a employs a combination (Db, Dm) selected from the group of combinations $(Db, Dm)_n$ in order to control the bias current Ib and the modulation current Im.

The controlling means 12b of the laser light generator control circuit 1a can be constituted such that the combinations of the group of combinations $(Db, Dm)_n$ are combinations that are an approximation of the combinations specified such that the light emission power is constant and the extinction ratio is constant. In a preferred embodiment of the group of combinations, the combinations are a group that comprises a combination specified so that the light emission power is constant and the extinction ratio is constant.

The bias current and modulation current control circuit section 11 comprises a bias current control circuit 11a and a modulation current control circuit 11b. The bias current control circuit 11a receives the first control signal $V_2$ and thus generates a signal $I_2$ for controlling the bias current circuit. The bias current control circuit 11a can comprise an operational amplifier that comprises a V+ input and a V− input. The V+ input receives the first control signal $V_2$, while the V− input receives a feedback signal from the bias current circuit section 16. The modulation current control circuit 11b receives the second control signal $V_3$ and thus generates a signal $I_3$ for controlling the modulation current circuit. The modulation current control circuit 11b can comprise an operational amplifier that comprises a V+ input and a V− input. The V+ input receives the second control signal $V_3$, while the V− input receives a feedback signal from the modulation current circuit section 18.

The drive circuit 6 comprises a bias current circuit section 16, a modulation current circuit section 18 and a drive section 20. The bias current circuit section 16 comprises a bias current generator 16a and a variation detection section 16b.

The bias current generator 16a is disposed between the variation detection section 16b and the laser light generator 2. One end of the bias current generator 16a is connected to the laser light generator 2 via a node 6a. The bias current generator 16a receives the control signal $I_2$ from the bias current control circuit 11a via a node 6b and thus generates a bias current Ib. Further, the variation detection section 16b is connected to the bias current generator 16a via a node 16c, and detects a change in the bias current Ib. In order to detect this change, the variation detection section 16b can comprise a resistor. The voltage of the node 16c is supplied to the V− terminal of the bias current control circuit 11a via the node 6c. As a result of this connection, the bias current control circuit 11a generates the control signal $I_2$ so that the control signal $V_2$ is generated at the node 16c.

A modulation current generator 18a is disposed between a variation detection section 18b and the laser light generator 2. The modulation current generator 18a is connected to the laser light generator 2 via the node 6a, and receives the control signal $I_3$ from the modulation current control circuit 11b via a node 6e to thereby generate the modulation current Im. Further, the variation detection section 18b is connected to the modulation current generator 18a via anode 18c, and thus detects a change in the modulation current Im. Further, the variation detection section 18b can comprise a resistor for the change detection. The voltage of the node 18c is supplied to the V− terminal of the modulation current control circuit 11b via a node 6f. As a result of this connection, the modulation current control circuit 11b generates the control signal $I_3$ so that the control signal $V_3$ is generated at the node 18c.

The bias current Ib and the modulation current Im are supplied to the laser light generator 2. Further, the modulation current Im is supplied to the laser light generator 2 via the drive section 20. The drive section 20 comprises a differential pair section 20a. The differential pair section 20a comprises first and second transistors 20b and 20c respectively. Respective single terminals (the emitters) of the first and second transistors 20b and 20c are connected to each other via a node 20d. The node 20d is connected to the modulation current circuit section 18. Another terminal 20e (the collector) of the first transistor 20b is connected to the laser light generator 2 via the node 6a. The other terminal 20f (the collector) of the second transistor 20c is connected to a power supply line via the mode 20d. The control terminals (bases) 20g and 20h of the first and second transistors 20b and 20c respectively are connected to respective differential pair inputs 6g and 6h. The differential pair inputs 6g and 6h are supplied with a differential drive signal $V_{IN}$.

To cite an example of the constitution of the controlling means 12b, same may comprise a central processing device 20 such as a CPU, and a memory 22 for storing a program and control data. The memory 22 can comprise a nonvolatile memory 22a and a circuit section 22b for writing to the nonvolatile memory 22a.

The interface section 12e is connected via signal lines 28a and 28b to warning devices 26a and 26b that indicate the detection of an anomaly of the laser light generator 2.

Further, the interface section 12e is connected to controlling means 12b and thus sends control signals to the controlling means 12b and receives control signals from the controlling means 12b. Also, the interface section 12e is capable of receiving a signal for interrupting the light generation of the laser light generator 2 and of receiving a signal for starting the light generation of the laser light generator 2. The interface section 12e is also connected to an external control device 24 such as a computer via a communication line 28c. When the interface section 12e is used, the characteristic data of the semiconductor laser element which are stored in the external control device 24 can be loaded into the nonvolatile memory 22a through communication with the external control device 24. The characteristic data is data computed by the external control device 24, and data of a database or spreadsheet and so forth stored on a hard disk or similar. Also, because the interface section 12e is used to perform individual adjustment work processes required for the laser light generator control circuit, such adjustment allows the adjustment time to be shortened in comparison with manual adjustment. Moreover, in cases where individual characteristic data for each of the semiconductor light emitting elements which the laser light generator comprises are stored in the external control device 24 such as a computer, adjustment reflecting the individual characteristic data can be performed. Here, characteristic data includes the reference value and group of combinations (Db, Dm)$_n$. The interface section 12e also transmits the status of the control section 10 to the external control device 24.

(Second Embodiment)

Figure 2:
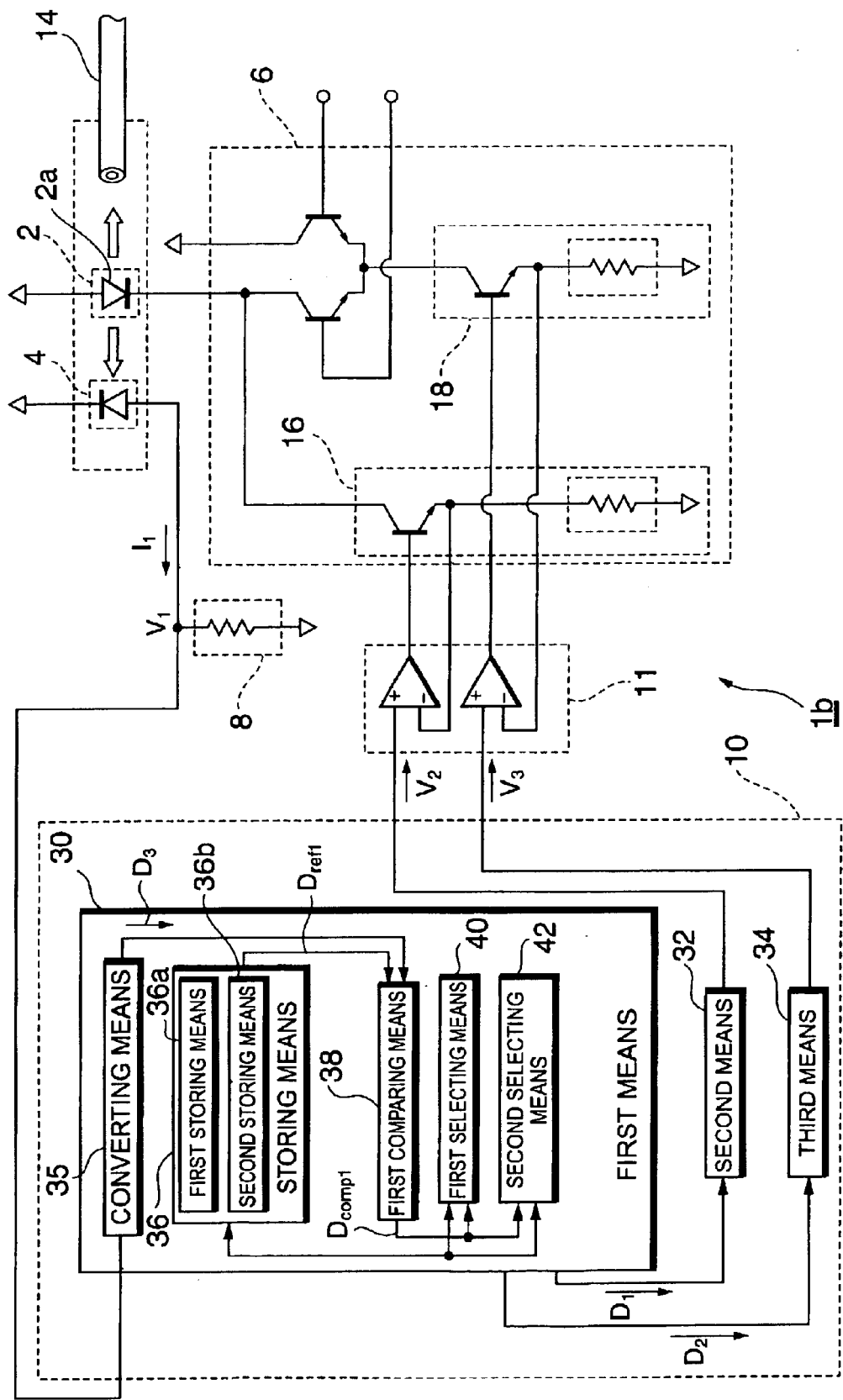
FIG. 2 is a block diagram showing the laser light generator control circuit according to an embodiment of the present invention.

FIG. 2 is a block diagram showing the laser light generator control circuit according to an embodiment of the present invention. The laser light generator control circuit 1b comprises a drive circuit 6, a load section 8, a control section 10, and a bias current and modulation current control circuit 11. In FIG. 2, the control section 10 is represented by functional blocks. In the laser light generator control circuit 1b, the control section 10 is constituted comprising first means 30, second means 32, and third means 34. Similarly to the first embodiment, the laser light generator control circuit 1b can further comprise the laser light generator 2 and the monitor light receiving element 4.

The first means 30 operate so as to select a combination (Db, Dm) from the group of combinations (Db, Dm)$_n$ in accordance with the result of a comparison between a reference value and a value that corresponds to the monitor voltage $V_1$ corresponding with the optical current $I_3$. The combination in the group of combinations (Db, Dm)$_n$ is specified so that the light emission power exhibits a predetermined dependence and the extinction ratio exhibits a predetermined dependence. The first means 30 obtain a first control value $D_1$ and a second control value $D_2$ on the basis of the selected combination (Db, Dm). The first means 30 can also provide the second means 32 and the third means 34 with the first control value $D_1$ and the second control value $D_2$, and so forth.

The second means 32 are constituted to receive the first control value $D_1$ from the first means 30 and operate so as to generate the first control signal $V_2$ on the basis of the first control value $D_1$. The third means 34 are constituted to receive the second control value $D_2$ from the first means 30 and operate so as to generate the second control signal $V_3$ on the basis of the second control value $D_2$.

The first means 30 comprise converting means 35, storing means 36, first comparing means 38, first selecting means 40, and second selecting means 42. The converting means 35 operate so as to convert the monitor voltage $V_1$ corresponding with the optical current value $I_1$ into a monitor signal $D_3$. The storing means 36 comprise first storing means 36a and second storing means 36b. The first storing means 36a stores the group of combinations (Db, Dm)$_n$ and a predetermined reference value $D_{refl}$.

Figures 3A, 3B:
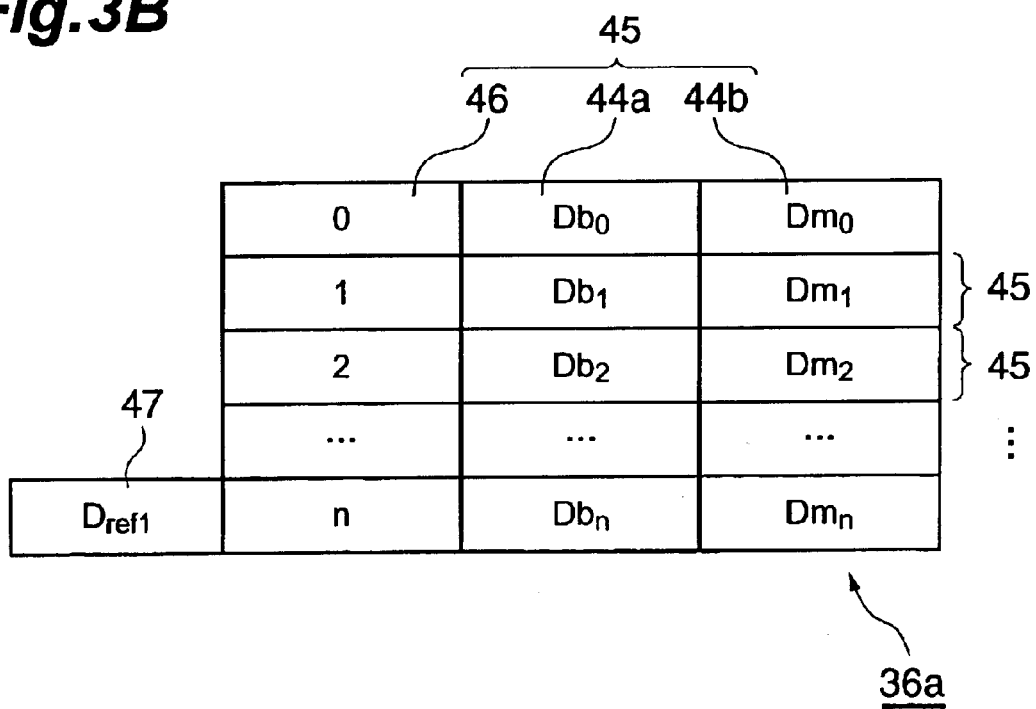
FIG. 3A is a table showing a group of combinations of the bias current and the modulation current that are specified so that the light emission power is constant and the extinction ratio is constant.
FIG. 3B shows the structure of the first storing means.

An example of the first storing means 36a will now be described. FIG. 3A is an example of a table in which combinations (Ib, Im) of the bias current Ib and the modulation current Im that have been measured for every individual semiconductor laser element 2a and that are specified so that the light emission power is constant and the extinction ratio is constant are arranged in order. Further, the first storing means 36a store a group (Db, Dm)$_n$ that comprises a plurality of combinations (Db, Dm) of the value Db that corresponds to the bias current Ib and the value Dm that corresponds to the modulation current Im, these combinations corresponding to the combinations of the bias current Ib and the modulation current Im shown in FIG. 3A. More specifically, for example, as shown in FIG. 3B, the first storing means 36a comprise a plurality of combination storage regions 45 each comprising a storage element 44a for storing the value Db and a storage element 44b for storing a value Dm, such that the combinations (Db, Dm) are stored in these combination storage regions 45. Further, although it is preferable that the combination storage regions 45 should each comprise an entry region 46 in which an entry number k for distinguishing the combinations from one another is stored and that a number corresponding to a sequence in a case where these combinations (Db, Dm) are arranged according to the order in which the bias current and the modulation current increase or decrease should be stored in the entry regions 46 for each of the combinations. However, another arrangement is possible. The first storing means 36a also comprise a storage region 47 for storing the predetermined reference value $D_{refl}$.

The second storing means 36b store present values for a value corresponding to the first control value $D_1$ ($D_1$ for example) and for a value corresponding to the second control value $D_2$ ($D_2$ for example) which are supplied by the first selecting means 40 and the second selecting means 42 respectively.

The first comparing means 38 receive the monitor signal $D_3$, and the reference value $D_{refl}$ from the storing means 36, and operate so as to compare this signal and value so as to provide a comparison signal $D_{comp1}$.

The first selecting means 40 is constituted to receive the comparison signal $D_{comp1}$ from the first comparing means 38, and, in a case where the comparison signal $D_{comp1}$ indicates that the monitor signal $D_3$ is smaller than the reference value $D_{refl}$ (where the optical current is smaller than a predetermined value), these means operate so as to select a combination (Db, Dm) affording an increase in the light amount of the laser light generator 2 from the group of combinations (Db, Dm)$_n$ stored in the first storing means 36a. For example, a combination for increasing the bias current and the modulation current that are supplied to the laser light generator 2 can be selected on the basis of the present values for value $D_1$ and $D_2$ which are stored in the second storing means 36b. Also, the first selecting means 40 supply the Db value in the combination (Db, Dm) as the first control value $D_1$, and supply the Dm value in the combination (Db, Dm) as the second control value $D_2$, on the basis of the selected combination (Db, Dm).

The second selecting means 42 is constituted to receive the comparison signal $D_{comp1}$ from the first comparing means 38, and, in a case where the comparison signal $D_{comp1}$ indicates that the monitor signal $D_3$ is greater than the reference value $D_{ref1}$ (where the optical current is greater than a predetermined value) these means operate so as to select a combination (Db, Dm) affording a reduction in the light amount of the laser light generator 2 from the group of combinations (Db, Dm)$_n$ stored in the first storing means 36a. For example, a combination for reducing the bias current and the modulation current that are supplied to the laser light generator 2 can be selected on the basis of the present values for value $D_1$ and $D_2$ which are stored in the second storing means 36b. Also, the second selecting means 42 supply the Db value in the combination (Db, Dm) as the first control value $D_1$, and supply the Dm value in the combination (Db, Dm) as the second control value $D_2$, on the basis of the selected combination (Db, Dm).

The first control value $D_1$ and the second control value $D_2$, which are supplied to the second means 32 and third means 34, are supplied by the first selecting means 40 or the second selecting means 42. Further, the bias current and the modulation current supplied to the laser light generator are updated via the second means 32 and the third means 34 on the basis of the first control value $D_1$ and the second control value $D_2$. Also, in cases where the monitor signal $D_3$ and the reference value $D_{ref1}$ are equal, the bias current and the modulation current are maintained without anew first control value $D_1$ and second control value $D_2$ being supplied.

The storing means 36 stores information that corresponds to the first control value $D_1$ and information that corresponds to the second control value $D_2$ at the time these values are updated. This information can be the combination (Db, Dm) selected by the first selecting means 40 or the second selecting means 42, and the entry number k pertaining to the selected combination (Db, Dm), for example, but is not limited to such information. On the basis of the information stored in the second storing means 36b, the first selecting means 40 and the second selecting means 42 are able to capture the first control value $D_1$ corresponding to the bias current and the second control value $D_2$ corresponding to the modulation current currently being supplied to the laser light generator, and are able to suitably select a combination set to bring about an increase or reduction in the light amount, from the group of combinations. More particularly, the entry number k which pertains to the combination selected by the first selecting means 40 or the second selecting means 42 is stored in the second storing means 36b, and, in a case where this entry number k is assigned to a sequence according to which the bias current and the modulation current increase or decrease for each combination as described earlier, the above-described combination can be suitably selected by selecting the combination which pertains to the entry number that precedes or follows this stored entry number k.

According to this embodiment, implementation is straightforward on account of the simplicity of the constitution adopted for the group of combinations. Further, it may be understood that control whereby the light emission power and extinction ratio are made to approach fixed values is possible in cases where the optical current varies. Further, the circuit scale can be reduced and a smaller number of steps is permitted for the processing program.

A nonvolatile memory can be adopted as the first storing means 36a and second storing means 36b. Accordingly, because the group of combinations and the reference value $D_{ref1}$ and so forth can be accessed directly after turning on the power supply of the laser light generator control circuit 1b, it is possible to operate the laser light generator control circuit 1b without settings being administered from the outside being performed.

(Third Embodiment)

Figure 4:
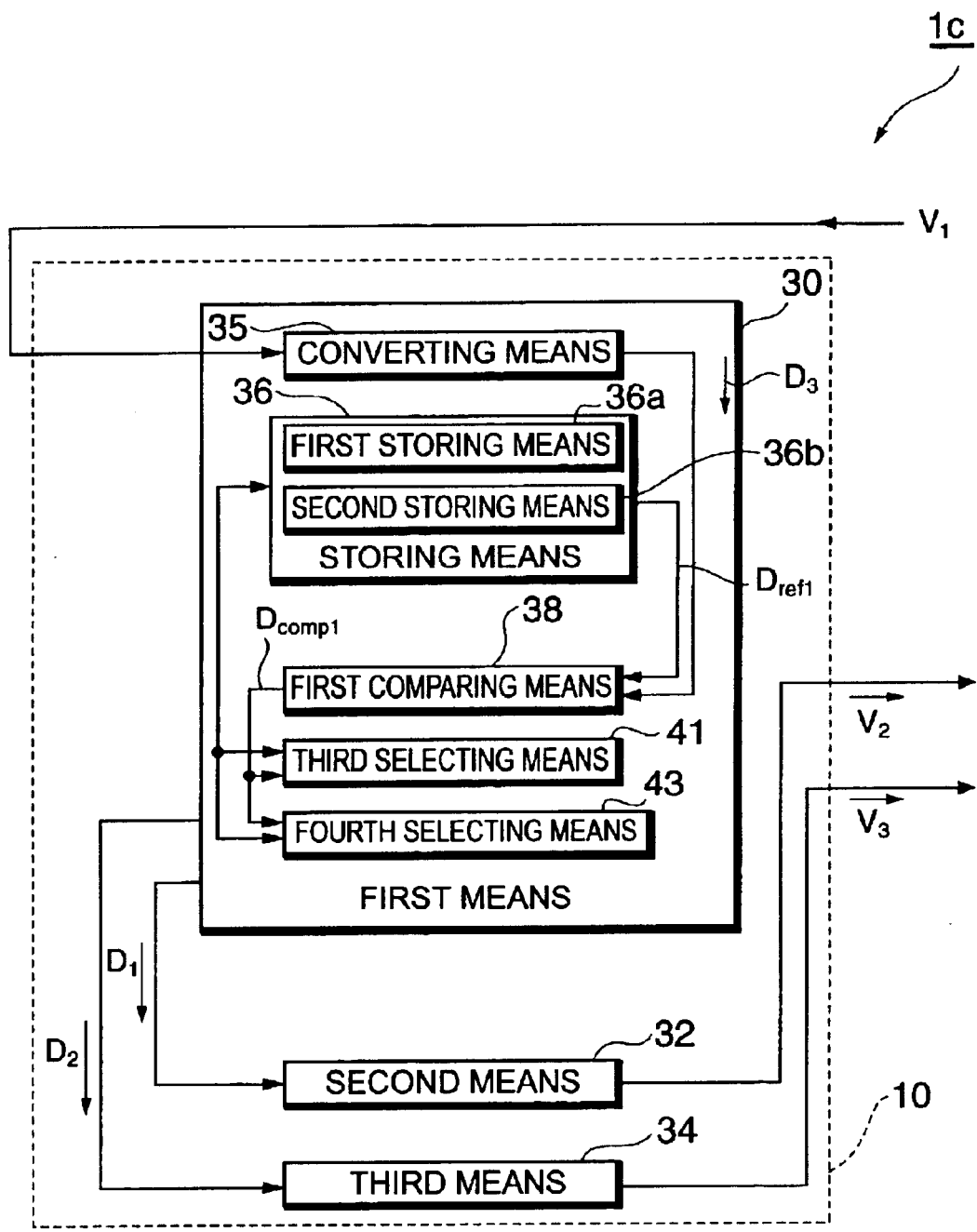
FIG. 4 is a block diagram showing the laser light generator control circuit according to an embodiment of the present invention.

FIG. 4 is a block diagram showing the laser light generator control circuit according to an embodiment of the present invention. The control section 10 of the laser light generator control circuit 1c comprises the first means 30, second means 32, and third means 34. The first means 30 are constituted comprising converting means 35, storing means 36, first comparing means 38, third selecting means 41, and fourth selecting means 43.

The third selecting means 41 are constituted to receive the comparison signal $D_{comp1}$ from the first comparing means 38, and, in a case where the comparison signal $D_{comp1}$ indicates that the monitor signal $D_3$ is smaller than the reference value $D_{ref1}$ (where the optical current is smaller than a predetermined value), these means operate so as to select a plurality of combinations that comprises a combination affording an increase in the light amount, from the group of combinations (Db, Dm)$_n$, generate an interpolation value $Db_p$ between a plurality of Db values in the plurality of combinations and provide this interpolation value $Db_p$ as the first control value $D_1$, and generate an interpolation value $Dm_p$ between a plurality of Dm values in the plurality of combinations and provide this interpolation value $Dm_p$ as the second control value $D_2$.

The fourth selecting means 43 are constituted to receive the comparison signal $D_{comp1}$ from the first comparing means 38, and, in a case where the comparison signal $D_{comp1}$ indicates that the monitor signal $D_3$ is greater than the reference value $D_{ref1}$ (where the optical current is greater than a predetermined value), these means operate so as to select a plurality of combinations that comprises a combination affording a reduction in the light amount, from (Db, Dm)$_n$ stored in the first storing means 36a, generate an interpolation value $Db_p$ between a plurality of Db values in the plurality of combinations and provide this interpolation value $Db_p$ as the first control value $D_1$, and generate an interpolation value $Dm_p$ between a plurality of Dm values in the plurality of combinations and provide this interpolation value $Dm_p$ as the second control value $D_2$.

These interpolation values are obtained by internal dividing Db intervals and Dm intervals in the selected plurality of combinations by means of a predetermined ratio such as (n−m): (n+m), for example (where n is a predetermined positive number and m is an integer, such that $-n \leq m \leq n$), in accordance with the present values for the first control value $D_1$ and the second control value $D_2$ which are stored in the second storing means 36b, for example.

For example, when two combinations ($Db_1$, $Dm_1$) and ($Db_2$, $Dm_2$) are divided internally at the ratio 1:1, a value corresponding to $Db_p = (Db_1 + Db_2)/2$ can be obtained for $D_1$ and a value corresponding to $Dm_p = (Dm_1 + Dm_2)/2$ can be obtained for $D_2$. The bias current and modulation current supplied to the laser light generator 2 are then updated via the second means 32 and third means 34 on the basis of the first control value $D_1$ and the second control value $D_2$.

Therefore, the bias current and the modulation current supplied to the laser light generator 2 can also be precisely controlled at a magnitude smaller than that corresponds to the interval between the combinations in the group of combinations $(Db, Dm)_n$ stored in the first storing means 36a and control whereby the light emission power and extinction ratio are made to approach fixed values is possible in small storage regions of the first storing means 36a, whereby high-precision power control is possible.

Further, the storing means 36 store information that corresponds to the first control value $D_1$ and information that corresponds to the second control value $D_2$ in the second storing means 36b at the time these values are updated. This information can be the $Db_p$ and $Dm_p$ generated by means of the third selecting means 41 or fourth selecting means 43, and the n and m pertaining to the above-described internal division, for example, but is not limited to such information.

(Fourth Embodiment)

Figure 5A:
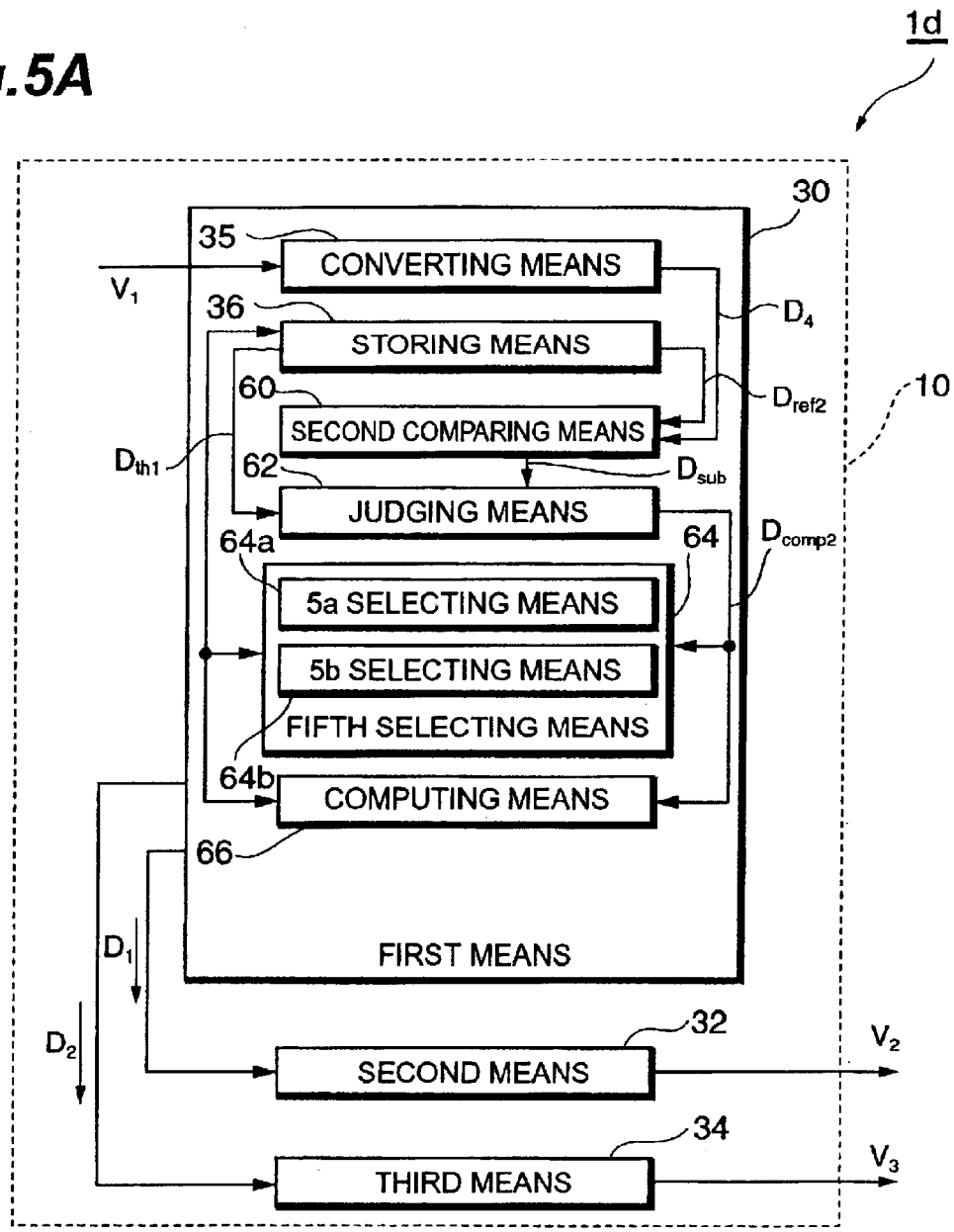
FIG. 5A is a block diagram showing the laser light generator control circuit according to an embodiment of the present invention.

FIG. 5A is a block diagram showing the laser light generator control circuit according to an embodiment of the present invention. The control section 10 of a laser light generator control circuit 1d comprises first means 30, second means 32, and third means 34. The first means 30 are constituted comprising converting means 35, storing means 36, second comparing means 60, judging means 62, fifth selecting means 64, and computing means 66.

Figure 5B:
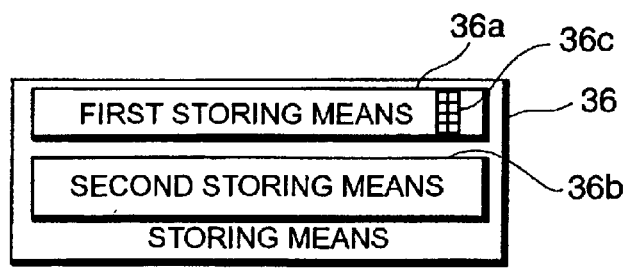
FIG. 5B is a block diagram showing the structure of the storing means.

FIG. 5B is a block diagram showing the structure of the storing means 36. In addition to storage regions for the group of combinations described above with reference to FIGS. 3A and 3B, and the reference value $D_{ref2}$, the first storing means 36a comprise a storage element 36c for storing data such as a threshold value $D_{th1}$. The second storing means 36b store generated information that corresponds to the first control value $D_1$ and information corresponding to the second control value $D_2$.

The second comparing means 60 receive the reference value $D_{ref2}$ from the second storing means 36b and a monitor signal $D_4$, and operate so as to compare this signal and value, so as to provide a comparison result $D_{sub}$ (difference, for example) that is quantitative information relating to the difference between the monitor signal $D_4$ and the reference value $D_{ref2}$.

The judging means 62 judge if either the absolute value of the comparison result $D_{sub}$ or the threshold value $D_{th1}$ is large and thus generates a judgment result $D_{comp2}$. The judgment result $D_{comp2}$ is generated by subtracting one value taken from the absolute value of the comparison result $D_{sub}$ and the threshold value $D_{th1}$ from the remaining other value which is the absolute value of the comparison result $D_{sub}$ or the threshold value $D_{th1}$, for example.

The fifth selecting means 64 comprise a 5a selecting means 64a similar to the first selecting means 40 and a 5b selecting means 64b similar to the second selecting means 42. The fifth selecting means 64 operate in a case where the judgment result $D_{comp2}$ from the judging means 62 indicates that the $D_{sub}$ absolute value is greater than the threshold value $D_{th1}$ (cases where the optical current absolute variation amount is judged to be significant). In other words, when the above condition is satisfied, the 5a selecting means 64a operate so as to select a combination (Db, Dm) that is set for an increase of the light amount of the laser light generator 2 from the group of combinations $(Db, Dm)_n$ stored in the first storing means 36a when the monitor signal $D_4$ is smaller than the reference value $D_{ref2}$ (when the optical current is smaller than a predetermined value), and to set Db in this combination as the first control value $D_1$ and Dm as the second control value $D_2$. Further, when this condition is satisfied, the 5b selecting means 64b operate so as to select a combination (Db, Dm) that is set for a reduction in the light amount of the laser light generator 2 from the group of combinations $(Db, Dm)_n$ stored in the first storing means 36a when the monitor signal $D_4$ is greater than the reference value $D_{ref2}$ (when the optical current is greater than a predetermined value), and to set Db in this combination as the first control value $D_1$ and Dm as the second control value $D_2$.

The computing means 66 operate so as to maintain the current bias current and modulation current in a case where the judgment result $D_{comp2}$ from the judging means 62 indicates that the $D_{sub}$ absolute value is smaller than the threshold value $D_{th1}$ (cases where the optical current absolute variation amount is judged to be insignificant). This is implemented, for example, by the control section 10 not selecting a new combination. However, another arrangement is possible.

According to the constitution of this embodiment, because control of the bias current and modulation current which corresponds to an absolute value for the difference between the monitor signal and reference value can be changed by the second comparing means 60, judging means 62 and computing means 66, a slight fluctuation in the bias current and modulation current can be prevented. Further, the threshold value $D_{th1}$ can be afforded a different value in accordance with the previous judgment result by the judging means 62 and slight fluctuations can be suppressed still further by means of such hysteresis.

Further, in the fifth selecting means 64, means similar to the third selecting means 41 in FIG. 4 may be adopted as the 5a selecting means 64a and means like the fourth selecting means 43 in FIG. 4 may be adopted as the 5b selecting means 64b so as to generate the first control value $D_1$ and the second control value $D_2$.

The second means 32 operate so as to generate the first control signal $V_2$ on the basis of the first control value $D_1$. The third means 34 operate so as to generate the second control signal $V_3$ on the basis of the second control value $D_2$.

(Fifth Embodiment)

Figure 6:
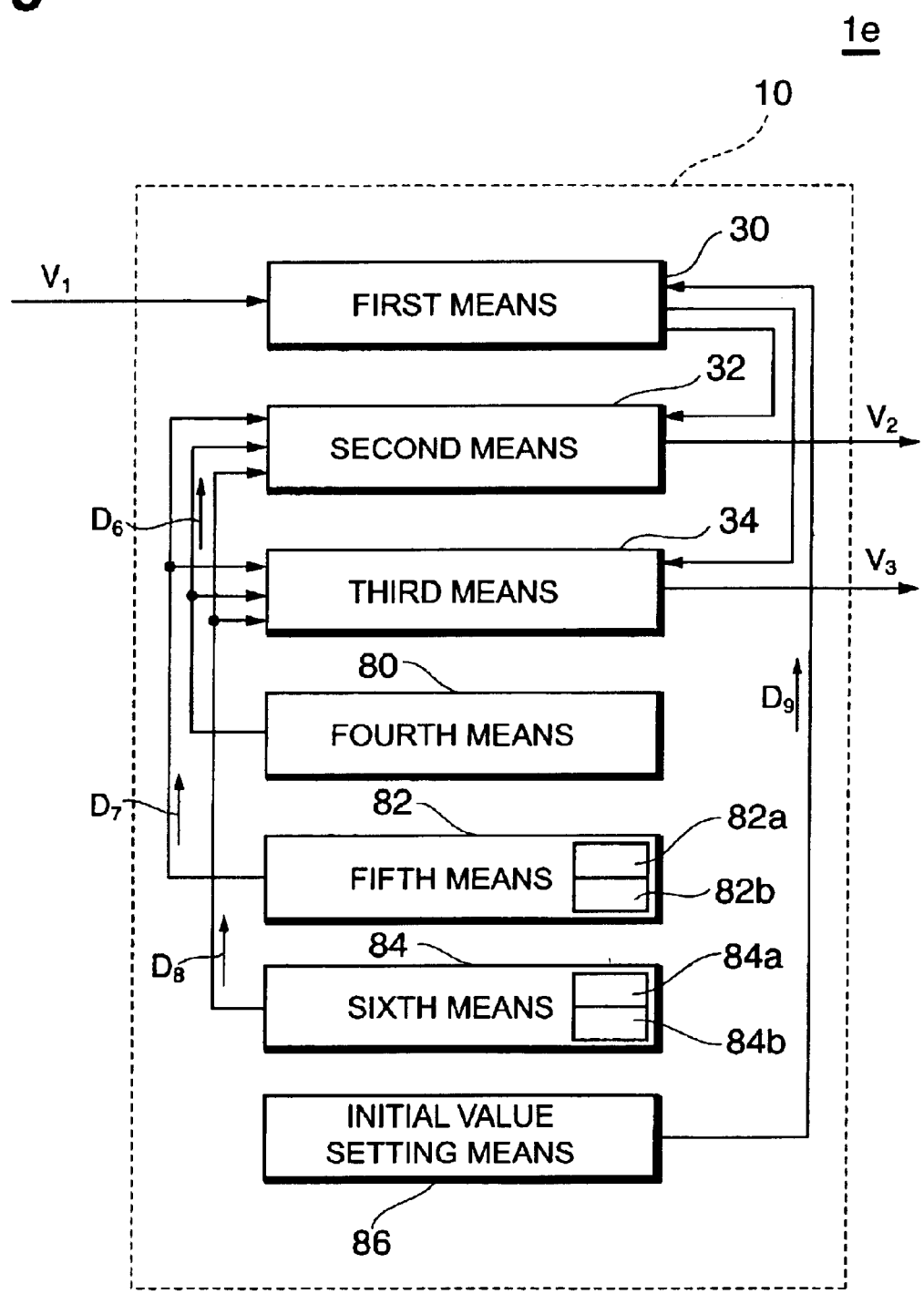
FIG. 6 is a block diagram showing the laser light generator control circuit according to an embodiment of the present invention.

FIG. 6 is a block diagram showing the laser light generator control circuit according to an embodiment of the present invention. The control section 10 of a laser light generator control circuit 1e comprises the first means 30, the second means 32, the third means 34, fourth means 80, fifth means 82, sixth means 84, and initial value setting means 86.

The fourth means 80 operate so as to generate a control signal $D_6$ such that the bias current and modulation current are not updated in a case where the absolute value for the difference between the monitor signal value $D_4$ corresponding to the monitor voltage $V_1$ that corresponds with the optical current $I_1$, and the reference value $D_{ref2}$ is less than the threshold value $D_{th1}$. According to this constitution, slight fluctuations in the bias current and modulation current can be prevented. The second means 32 and third means 34 operate so as to respond to this control signal $D_6$ and generate the first control signal $V_2$ and second control signal $V_3$ for maintaining the bias current and the modulation current.

The fifth means 82 operate so as to generate a control signal $D_7$ so that the bias current and modulation current are not increased in at least either a case where the first control value $D_1$ supplied by the first means 30 exceeds a bias current threshold value $D_{th2}$ (where the bias current exceeds a predetermined value) or a case where the second control value $D_2$ supplied by the first means 30 exceeds a modulation current threshold value $D_{th3}$ (where the modulation current exceeds a predetermined value). The second means 32 and third means 34 operate so as to respond to this control signal $D_7$ and generate the first control signal $V_2$ and second control signal $V_3$ so that the bias current and the modulation current are not increased. According to this constitution, the supply of an overcurrent to the drive circuit can be prevented by detecting an excessive bias current and modulation current.

In order to implement this function, the fifth means 82 are constituted so as to comprise means 82a for detecting the generation of either a case where the first control value $D_1$ supplied by the first means 30 exceeds the bias current threshold value $D_{th2}$ (where the bias current exceeds a predetermined value) or a case where the second control value $D_2$ supplied by the first means 30 exceeds the modulation current threshold value $D_{th3}$ (where the modulation current exceeds a predetermined value), as well as means 82b for generating the control signal $D_7$ in response to such detection. Further, the fifth means 82 can be used to set the initial values of the laser light generator control circuit.

When the fifth means 82 are used, even when the environment of the semiconductor laser element temporarily deviates from the specified range, control to keep the light emission power and extinction ratio constant can be started from the point when the environment returns to within the specified range. Further, an overcurrent can be prevented when the laser diode starts up or when the laser module breaks down, for example.

The sixth means 84 generate a control signal $D_8$ so that the bias current and the modulation current are not reduced in at least either a case where the first control value $D_1$ supplied by the first means 30 is less than a bias current threshold value $D_{th4}$ (where the bias current is less than a predetermined value) or a case where the second control value $D_2$ supplied by the first means 30 is less than a modulation current threshold value $D_{th5}$ (where the modulation current is less than a predetermined value). The second and third means respond to this control signal $D_8$ and operate so as to generate the first control signal $V_2$ and second control signal $V_3$ so that the bias current and the modulation current are not reduced. According to this constitution, a drop in the optical output of the laser light generator is detected.

In order to implement this function, the sixth means 84 are constituted so as to further comprise means 84a for detecting the generation of either a case where the first control value $D_1$ supplied by the first means 30 is less than the bias current threshold value $D_{th4}$ or a case where the second control value $D_2$ supplied by the first means 30 is less than the modulation current threshold value $D_{th5}$, as well as means 84b for generating the control signal $D_8$ in response to such detection. Further, the sixth means 84 can be used to set the initial values of the laser light generator control circuit.

When the sixth means 84 are used, even when the environment of the semiconductor laser element temporarily deviates from the specified range, control to keep the light emission power and extinction ratio constant can be started from the point when the environment returns to within the specified range.

When the laser light generator control circuit 1e starts up, the initial value setting means 86 operate so as to generate a control signal $D_9$ so that the first means 30 are caused to sequentially select combinations (Db, Dm) for an increase in the bias current and the modulation current, from the group of combinations $(Db, Dm)_n$. More specifically, combinations are sequentially selected so that the bias current and the modulation current increase at a predetermined rate of increase with respect to time. This rate of increase may be linear or nonlinear with respect to time. According to this constitution, it is possible to prevent an overcurrent from transiently flowing to the laser light generator 2 when the operation of the laser light generator 2 is started.

Constants such as the reference value $D_{ref2}$, the threshold value $D_{th1}$, the bias current threshold value $D_{th2}$, the modulation current threshold value $D_{th3}$, the bias current threshold value $D_{th4}$, the modulation current threshold value $D_{th5}$, and the sequence of combinations for a gradual increase in the bias current and modulation current, which appear in this embodiment and in other embodiments, can be stored in the storage element 36c in the first storing means 36a.

(Sixth Embodiment)

Figure 7:
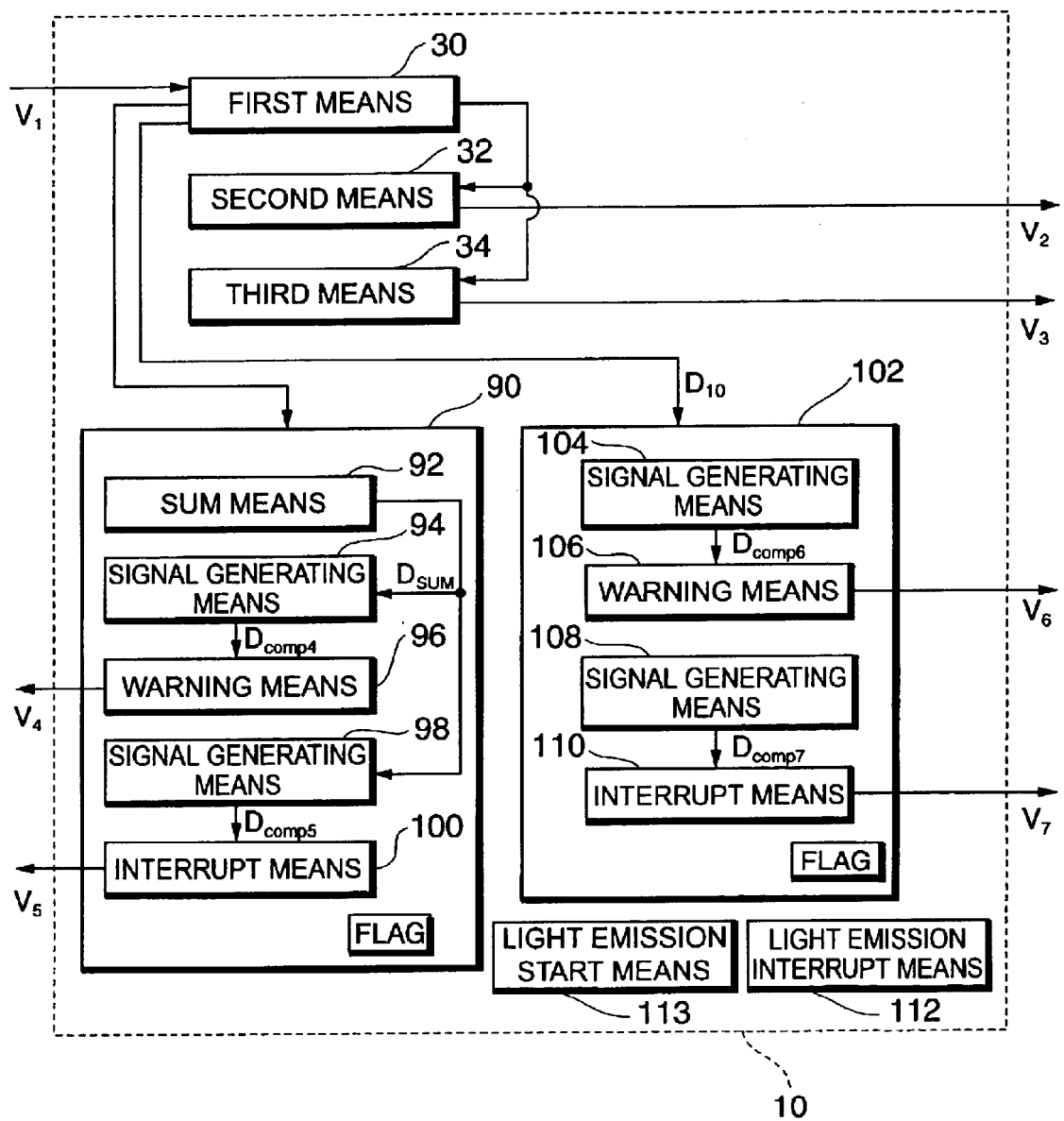
FIG. 7 is a block diagram showing the laser light generator control circuit according to an embodiment of the present invention.

FIG. 7 is a block diagram showing the laser light generator control circuit according to an embodiment of the present invention. The control section 10 of a laser light generator control circuit 1f comprises the first means 30, the second means 32, and the third means 34. Further, the control section 10 can further comprise overcurrent sensing means 90 for sensing an overcurrent of the laser light generator. Breakdown and deterioration of the laser light generator can be sensed by these means 90. The control section 10 can further comprise power drop sensing means 102 for sensing a power drop in the laser light generator. Breakdown and deterioration of the laser light generator can be sensed by these means 102.

Usage of both the overcurrent sensing means 90 and the power drop sensing means 102 permits a distinction between a state (of deterioration) where a predetermined optical power is generated by the laser light generator but the supply current is too large, and a state (of breakdown) where light is not emitted by the laser light generator, for example. It is thus possible to exchange the optical module upon detection of deterioration of the laser light generator and to thus avoid an unexpected situation such as the shutdown of the system.

The overcurrent sensing means 90 are constituted comprising means 92 for generating a sum $D_{sum}$ of the first control value $D_1$ and the second control value $D_2$; means 94 for generating a comparison signal $D_{comp4}$ in a case where the sum $D_{sum}$ is equal to or more than a threshold value $D_{th6}$; and means 96 for generating a first warning signal $V_4$ for indicating an overcurrent of the laser light generator 2 in response to the comparison signal $D_{comp4}$. According to this constitution an overcurrent of the laser light generator 2 can be detected. Also, the overcurrent sensing means 90 may be constituted comprising means 98 that comprise a storage element for storing a flag which is set when the first warning signal $V_4$ is generated and that serve to generate a comparison signal $D_{comp5}$ in a case where the sum $D_{sum}$ is less than the threshold value $D_{th7}$ when this flag is thus set; and means 100 for generating a first interrupt signal $V_5$ for interrupting the first warning signal $V_4$ in response to the comparison signal $D_{comp5}$.

According to this constitution, a warning for a detected overcurrent can be canceled. This comparison can also be performed by means of the first control value $D_1$ and the second control value $D_2$ instead of the $D_{sum}$. If the threshold value $D_{th7}$ is determined in the overcurrent sensing means 90 so that hysteresis is maintained for the threshold value $D_{th6}$, fluctuations of the warning output can be prevented.

The power drop sensing means 102 are constituted comprising means for generating a comparison signal $D_{comp6}$ that indicates that a monitor signal $D_{10}$ corresponding to the optical current is equal to or less than a threshold value $D_{th8}$, and means for generating a second warning signal $V_6$ that indicates a drop in the light emission power of the laser light generator 2 in response to the comparison signal $D_{comp6}$. According to this constitution, a drop in the light emission power of the laser light generator can be detected. Further, the power drop sensing means 102 can also be constituted comprising means that comprise a storage element for storing a flag which is set when the second warning signal $V_6$ is generated and that serve to generate a comparison signal $D_{comp7}$ in a case where the monitor signal $D_{10}$ is equal to or more than the threshold value $D_{th9}$ when this flag is thus set; and means for interrupting the second warning signal $V_6$ in response to the comparison signal $D_{comp7}$. According to this constitution, the warning for the detected power drop can be canceled. If the threshold value $D_{th7}$ is determined in the power drop sensing means 102 so that hysteresis is maintained for the threshold value $D_{th6}$, fluctuations of the warning output can be prevented.

Light emission interrupt means 112 operate so as to interrupt the light generation of the laser light generator by providing a response to a signal from the interface section. Light emission start means 113 operates so as to start the light generation of the laser light generator by providing a response to a signal from the interface section. By providing these means, the failure of an optical connector that is connected to the laser light generator control circuit can be detected and the optical output interrupted so as to prevent a problem caused by the leakage of laser light from arising. Further, because the optical output from the laser light generator can be intentionally turned ON/OFF, it is possible to confirm the continuity of optical fiber to which the laser light generator is optically coupled, for example.

(Seventh Embodiment)

The laser light generator control circuit shown in the above embodiment controls the bias current and the modulation current on the basis of signals from the laser light generator 2. By means of this circuit, not only is it possible to control the light emission power so that same approaches a fixed value by means of control employing the group of combinations $(Db, Dm)_n$, control whereby the extinction ratio approaches a fixed value can also be carried out by means of control employing the group of combinations $(Db, Dm)_n$.

It will be shown next that control whereby the light emission power and extinction ratio approach fixed values is possible by means of the laser light generator control circuit illustrated in the above embodiment.

Figure 8:
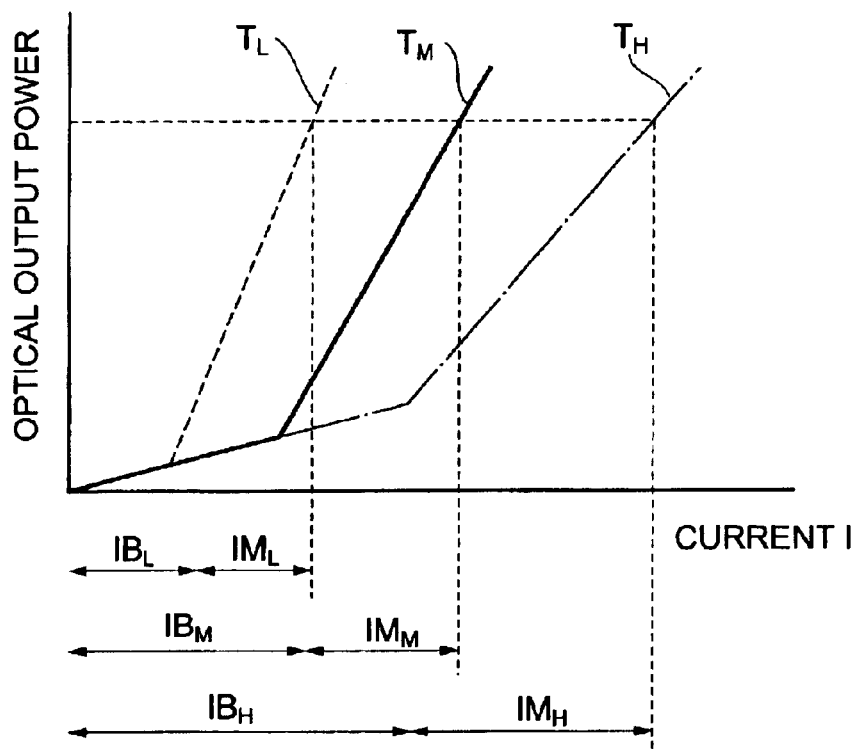
FIG. 8 shows the I-L characteristic of a semiconductor laser element.

FIG. 8 shows an I-L characteristic diagram of a semiconductor laser element, the drive current being plotted on the horizontal axis and optical output power being plotted on the vertical axis. In FIG. 8, the symbol $T_M$ denotes an I-L characteristic line at a normal temperature (25° C., for example), the symbol $T_L$ denotes an I-L characteristic line at a low temperature (<25° C., for example), and the symbol $T_H$ denotes an I-L characteristic line at a high temperature (>25° C., for example). According to this characteristic diagram, in order to obtain a fixed light emission power, the drive current must be increased as the temperature rises. The drive current comprises the bias current and the modulation current. The ratio between the bias current and the modulation current varies with temperature. However, by controlling the laser drive current by dividing same into the bias current and the modulation current, the extinction ratio can be controlled in addition to the optical output power. Also, the laser diode threshold value current $I_{th}$ varies between individual semiconductor laser elements. However, with the technique described in the above embodiment, adjustments can be individually made with respect to such variation.

Figure 9:
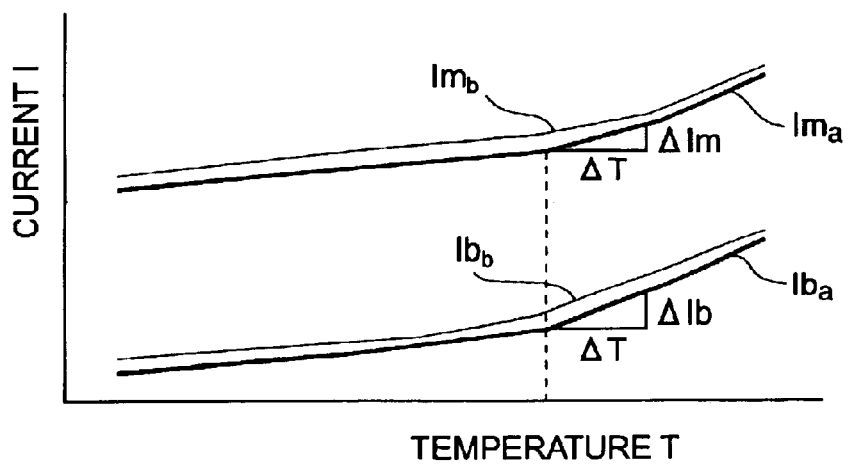
FIG. 9 shows characteristic curves illustrating the temperature dependence of the bias current and the modulation current which are measured while being adjusted so that the light emission power and extinction ratio of the semiconductor laser element are constant.

The present inventors specified $I_{th}+I\alpha$ (where $I_{th}$ is the threshold value current) as the bias current Ib, and the difference between the laser drive current and the bias current as the modulation current Im. The present inventors measured the temperature dependence of the bias current and modulation current of the semiconductor laser element. FIG. 9 shows the temperature dependence of the bias current and the modulation current which are measured while being adjusted so that the light emission power and extinction ratio of the semiconductor laser element are constant, current being plotted on the vertical axis and temperature on the horizontal axis. In FIG. 9, the symbols $Ib_a$ and $Im_a$ show the initial current characteristic of the semiconductor laser element. When Ib and Im are varied along the curves $Ib_a$ and $Im_a$, the light emission power and extinction ratio can be kept constant.

In other words, when a slight temperature change $\Delta T$ occurs, because the light emission threshold value current rises and the light emission efficiency drops, the light emission power drops. In order to maintain the light emission power at the desired value, the bias current Ib and the modulation current Im must be increased. For example, when the light emission power is kept constant by increasing only the bias current Ib, the extinction ratio drops. On the other hand, when the light emission power is kept constant by increasing only the modulation current Im, the extinction ratio rises. In order to keep the extinction ratio and the light emission power constant, the $\Delta Ib$ and $\Delta Im$ may be increased in accordance with the inclination of the characteristic curves $Ib_a$ and $Im_a$.

The present inventors also measured the temperature dependence of the bias current Ib and the modulation current Im of a semiconductor laser element whose characteristics had changed through extended use (deterioration) under the same conditions. In FIG. 9, the symbols $Im_b$ and $Ib_b$ show the temperature dependence of this semiconductor laser element. The present inventors tried comparing the characteristic curves $Im_a$ and $Ib_a$ with the characteristic curves $Im_b$ and $Ib_b$. From the result of this comparison, it became clear that the characteristic curves $Im_b$ and $Ib_b$ could be approximately obtained by shifting the characteristic curves $Im_a$ and $Ib_a$ to the left (low temperature region) This shift shows that, where the semiconductor laser element with deteriorated characteristics is concerned, when the bias current and the modulation current are not increased, the light emission power and extinction ratio are not kept constant.

The present inventors directed their attention toward expressing a deterioration of semiconductor laser element characteristics in terms of the shift of a characteristic curve in FIG. 9. In FIG. 9, given a certain bias current Ib, the differential coefficient $(\Delta Ib/\Delta T)_a$ of the characteristic curve $Ib_a$ is substantially equal to the differential coefficient $(\Delta Ib/\Delta T)_b$ of the characteristic curve $Ib_b$. This indicates that the shape of the characteristic curve does not change as a result of deterioration in the characteristics of the semiconductor laser element. Therefore, the method of this embodiment not only permits control of the light emission power and extinction ratio so that same approach fixed values, but also permits compensation for deterioration in the characteristics of semiconductor laser elements.

Figure 10:
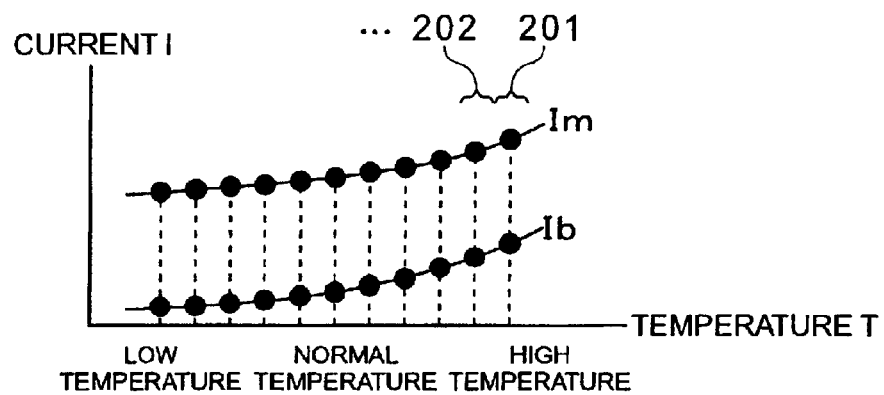
FIG. 10 shows a method for sampling combinations of Im and Ib from the characteristic curves in FIG. 9.

The group of combinations $(Db, Dm)_n$ of the value Db that corresponds to the bias current Ib and the value Dm that corresponds to the modulation current Im can be determined by means of the following procedure. In other words, the characteristic curves in FIG. 9 are sampled at predetermined intervals along the horizontal axis (see FIG. 10) to thereby capture a plurality of combinations 201, 202, and so forth of Ib and Im, and a group of combinations $(Db, Dm)_n$ can be captured easily by obtaining values Db that correspond to Ib and values Dm that correspond to Im. Further, when a group is formed by arranging these combinations in the order of the temperatures on the horizontal axis at which these combinations were sampled, the result is a group of combinations which are arranged according to a sequence in which Ib and Im increase or decrease, which corresponds to a sequence in which the light amount is increased or reduced.

Further, a constant interval, intervals such that the variation amount of Ib and Im is constant, and intervals whereby the monitor value variation amount is constant can be adopted, for example, as this sampling interval. According to the experiments of the present inventors, the group of combinations exhibits a different inclination depending on the production lot of the laser diode element. It was also evident that individual differences were large at least with respect to Ib in laser diode elements in these production lots. In consequence, the determination of the group of combinations $(Db, Dm)_n$ is preferably performed for each production lot, and more preferably performed for individual laser diode elements. Also, in cases where it is not necessary to maintain the extinction ratio this accurately, the same group of combinations may be used for different kinds of laser diode element.

Further, the above-described characteristic curve can be obtained according to theoretical characteristics of light emitting elements, shipping data accompanying the products, or actual measurement data and so forth.

A description follows for an example of a method for adjusting the laser light generator control circuit so that same operates as described in the above embodiment.

(1) The laser light generator control circuit to be adjusted is held at a predetermined ambient temperature.

(2) A specified combination is selected from the group of combinations for the laser light generator so as to obtain the desired optical output power. Then, values corresponding to this specified combination are stored in the storing means in the laser light generator control circuit. These values provide initial values to produce correction operation of the laser light generator control circuit.

(3) The optical current from the monitor light receiving element is measured. A value corresponding to this optical current is then stored in storing means in the laser light generator control circuit (reference numeral 36 in FIG. 2). This value provides a reference value for the optical output power when the laser light generator control circuit is allowed to operate correctly.

As a result of these processes, a laser light generator control circuit in which individual differences in the bias current and modulation current of the semiconductor laser element as well as the reception sensitivity of the monitor light receiving element are adjusted is obtained.

It can be understood from the description thus far that if a group of combinations whereby the laser light generator outputs a constant optical output power with respect to a temperature change is captured, and a reference value for the optical output power is determined, control is possible so that the optical output power and extinction ratio of the laser diode approach fixed values over a wide temperature range.

(Eighth Embodiment)

Figure 11:
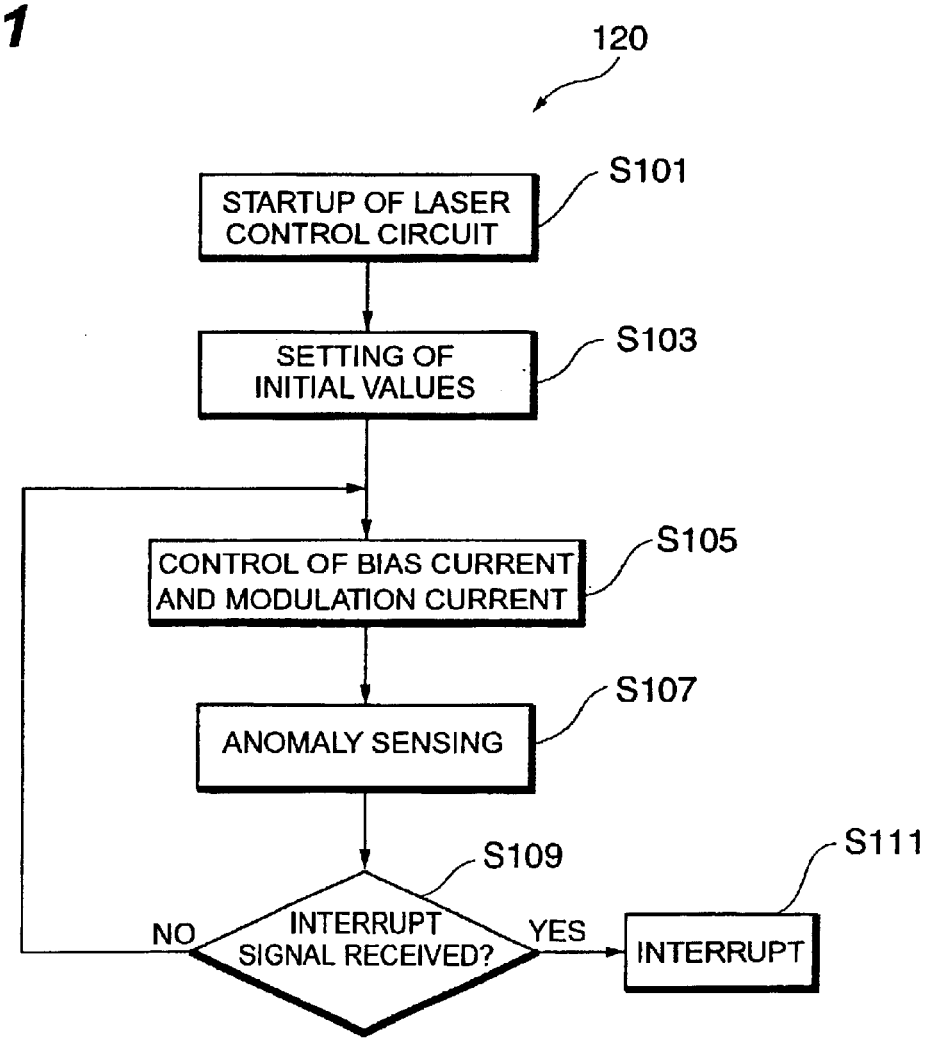
FIG. 11 is a flowchart showing the method for controlling a laser diode.

FIG. 11 is a flowchart showing the method for controlling a laser diode. In the flowchart 120, the laser light generator control circuit starts up in step S101, and initial values for controlling the bias current and modulation current are set by starting up the initial value setting means in step S103. These initial values include a reference value for the optical output power, and a combination (Db, Dm) of the value Db and value Dm so that the desired optical output power and extinction ratio are outputted. After suitable initial values are set, control of the bias current and modulation current on the basis of the optical current value from the light receiving element is performed in step S105 by using the group of combinations $(Db, Dm)_n$. Further, the existence of anomalies with the parameters for controlling the laser light generator control circuit is sensed in step S107. Thereafter, in step S109, it is judged whether or not an interrupt signal has been received via the interface section. When an interrupt signal has been received, the interrupt means start up and interrupt the operation of the laser light generator control circuit instep S111. When an interrupt signal has not been received, processing returns to step S105 and hence steps S105, S107 and S109 are repeated until the interrupt signal is received. The function realized by the control flow shown in FIG. 11 can also be implemented by using an interrupt function.

Figure 12:
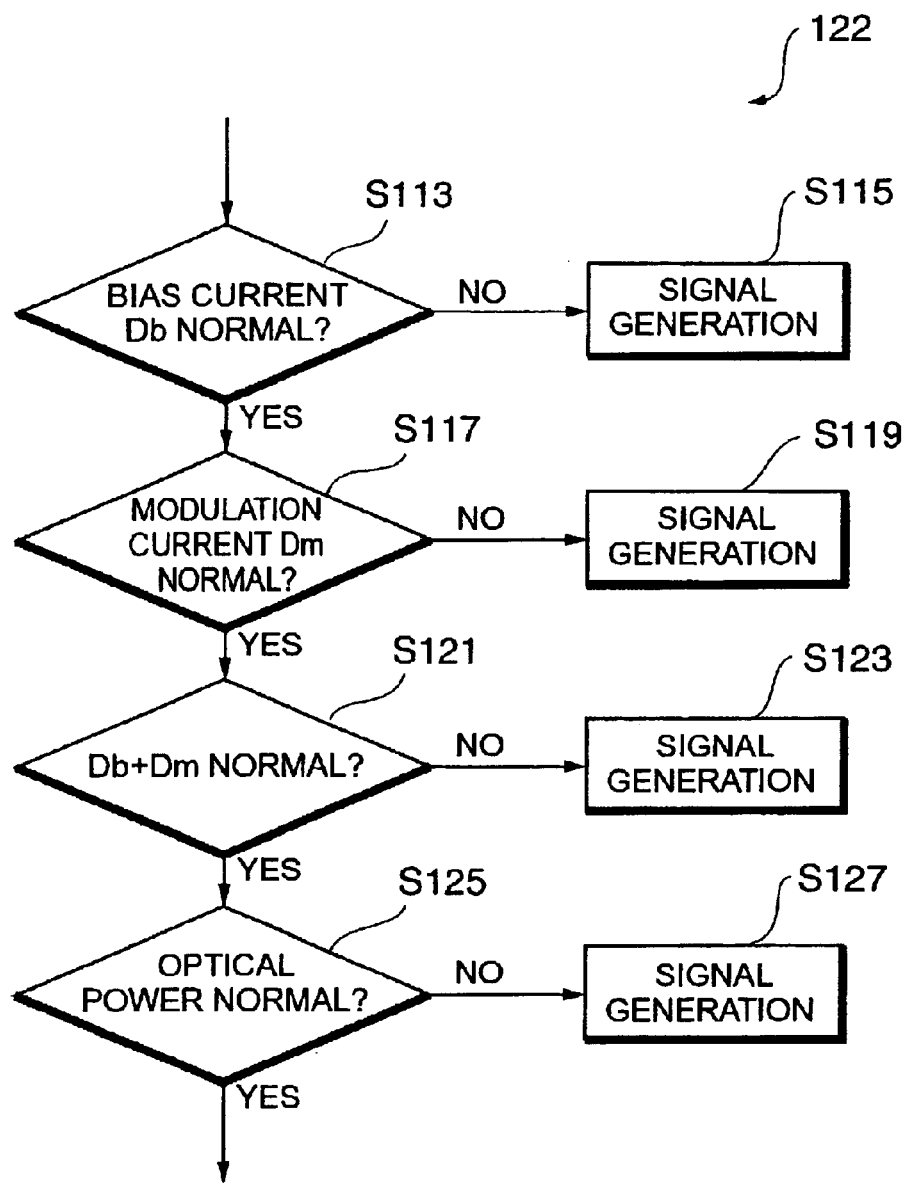
FIG. 12 is a flowchart showing an anomaly sensing step in detail.

FIG. 12 is a flowchart 122 showing step S107 in detail. In the anomaly sensing step, it is judged whether or not the bias current value is normal in step S113. In a case where the judgment result indicates an anomaly, a signal that indicates that the bias current is abnormal is generated in step S115. In a case where the judgment result indicates a normal bias current, it is judged whether or not the modulation current value is normal in step S117. In a case where the judgment result indicates an anomaly, a signal that indicates that the modulation current is abnormal is generated in step S119. In a case where the judgment result indicates a normal modulation current, it is judged whether or not sum of the bias current and the modulation current value is normal in step S121. In a case where the judgment result indicates an anomaly, a signal that indicates that the sum of the currents is abnormal is generated in step S123. In a case where the judgment result indicates a normal current sum, it is judged whether or not the optical output power is normal in step S125. In a case where the judgment result indicates an anomaly, a signal that indicates that the optical output power is abnormal is generated in step S127. In a case where the judgment result indicates a normal optical output power, the anomaly sensing step S107 is terminated. Further, part of the sensing in the anomaly sensing step S107 could also be performed.

Figure 13:
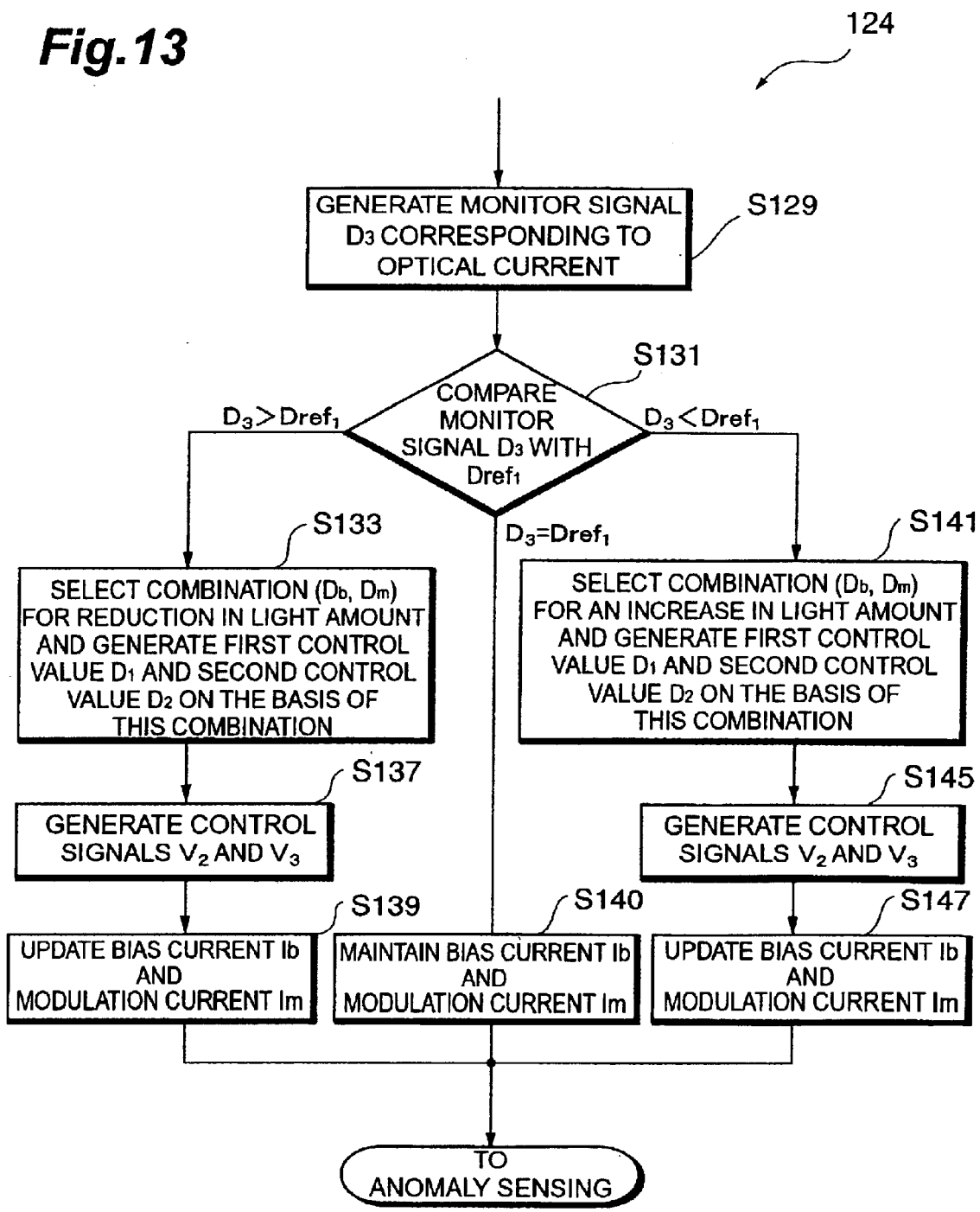
FIG. 13 is a flowchart showing a control procedure for the bias current and the modulation current.

FIG. 13 is a flowchart 124 showing the control procedure of step S105. In step S105, control of the bias current and modulation current is performed on the basis of the optical current value from the monitor light receiving element, after the suitable values for the bias current and modulation current. The monitor signal $D_3$ that corresponds to the optical current from the monitor light receiving element is generated in step S129. The monitor signal $D_3$ is then compared with the reference value $D_{ref1}$ in step S131.

In a case where the comparison result indicates that $D_3 > D_{ref1}$ (where the optical current is greater than a predetermined value), in step S133, a combination (Db, Dm) for a reduction in the light amount of the laser light generator is selected from the group of combinations $(Db, Dm)_n$ and the first control value $D_1$ and the second control value $D_2$ are generated on the basis of this combination. Next, in step S137, the first control signal $V_2$ is generated on the basis of the first control value $D_1$ and the second control signal $V_3$ is generated on the basis of the second control value $D_2$. In step S139, the bias current Ib and modulation current Im are generated on the basis of the first control signal $V_2$ and the second control signal $V_3$. These currents are then applied to the laser diode. Further, the light from the laser diode is inputted to the monitor light receiving element.

In a case where the comparison result indicates that $D_3<D_{ref1}$ (where the optical current is smaller than a predetermined value), in step S141, a combination (Db, Dm) for an increase in the light amount of the laser light generator is selected from the group of combinations $(Db, Dm)_n$ and the first control value $D_1$ and the second control value $D_2$ are generated on the basis of this combination. Next, in step S143, the first control signal $V_2$ is generated on the basis of the first control value $D_1$ and the second control signal $V_3$ is generated on the basis of the second control value $D_2$. In step S147, the bias current Ib and modulation current Im are generated on the basis of the first control signal $V_2$ and the second control signal $V_3$. These currents are then applied to the laser diode. Further, the light from the laser diode is inputted to the monitor light receiving element.

In a case where the comparison result indicates that $D_3=D_{ref1}$ (where the optical current is equal to a predetermined value), the bias current Ib and modulation current Im are maintained in step S140.

Upon completion of steps S139, S147 and S140, control proceeds with the anomaly sensing step. The sensing of an anomaly can also be performed by using interrupt processing.

Figure 14:
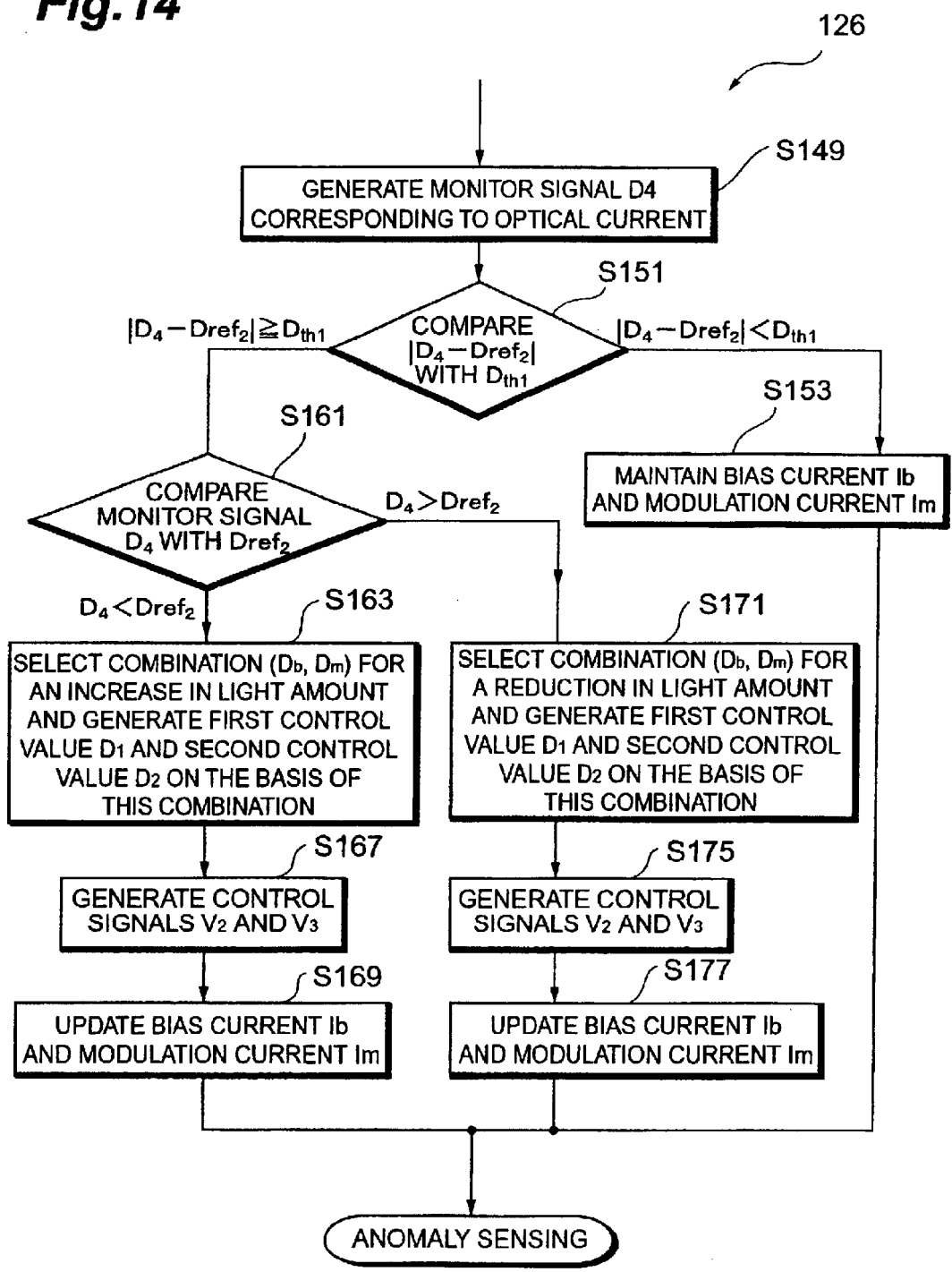
FIG. 14 is another flowchart showing the control procedure for the bias current and the modulation current.

FIG. 14 is a flowchart 126 showing another control procedure of step S105 in detail. A monitor signal $D_4$ that corresponds to the optical current from the monitor light receiving element is generated in step S149. Next, the monitor signal $D_4$ is compared with a reference value $D_{ref2}$ in step S151. For the purpose of this sensing, in the present embodiment, the difference between the monitor signal $D_4$ and $D_{ref2}$ is generated and then the absolute value $(D_4-D_{ref2})_{ABS}$ for this difference is compared with the threshold value $D_{th1}$.

In a case where the comparison result indicates that $(D_4-D_{ref2})_{ABS} \geq$ the threshold value $D_{th1}$ (where the optical current variation amount is significant), the monitor signal $D_4$ is compared with the reference value $D_{ref2}$ in step S161.

In a case where the comparison result indicates that $D_4>D_{ref2}$ (where the optical current is larger than a predetermined value), in step S171, a combination (Db, Dm) for a reduction in the light amount of the laser light generator is selected from the group of combinations and the first control value $D_1$ and the second control value $D_2$ are generated on the basis of this combination. Next, in step S175, the first control signal $V_2$ is generated on the basis of the first control value $D_1$ and the second control signal $V_3$ is generated on the basis of the second control value $D_2$. In step S177, the bias current Ib and modulation current Im are generated on the basis of the first control signal $V_2$ and the second control signal $V_3$. These currents are then applied to the laser diode. Further, the light from the laser diode is inputted to the monitor light receiving element.

In a case where the comparison result indicates that $D_4<D_{ref2}$ (where the optical current is smaller than a predetermined value), in step S163, a combination (Db, Dm) for an increase in the light amount of the laser light generator is selected from the group of combinations and the first control value $D_1$ and the second control value $D_2$ are generated on the basis of this combination. Next, in step S167, the first control signal $V_2$ is generated on the basis of the first control value $D_1$ and the second control signal $V_3$ is generated on the basis of the second control value $D_2$. In step S169, the bias current Ib and modulation current Im are generated on the basis of the first control signal $V_2$ and the second control signal $V_3$. These currents are then applied to the laser diode. Further, the light from the laser diode is inputted to the monitor light receiving element.

In a case where the comparison result indicates that $(D_4-D_{ref2})_{ABS}<$ the threshold value $D_{th1}$ (where the optical current variation amount is not significant), in step 153, the first control value $D_1$ and the second control value $D_2$ are maintained without selecting a new combination (Db, Dm) and hence the first control signal $V_2$ and second control signal $V_3$ are maintained. The bias current Ib and the modulation current Im are then maintained on the basis of the first control signal $V_2$ and second control signal $V_3$. These currents are then applied to the laser diode. Further, the light from the laser diode is inputted to the monitor light receiving element.

Upon completion of steps S169, S177 and S153, control proceeds with the anomaly sensing step. The sensing of an anomaly can also be performed by using interrupt processing.

The method for controlling the laser diode has been described with reference to FIGS. 11 to 14. However, as is described in an embodiment prior to this one, in steps S137, S145, S167, and S175, Db in the selected combination can be set as the first control value $D_1$ and Dm as the second control value $D_2$ in the same manner as by the first selecting means 40 and the second selecting means 42, and, the interpolation value $Db_p$ can be adopted as the first control value $D_1$, and the interpolation value $Dm_p$ can be adopted as the second control value $D_2$, in the same way as performed by the third selecting means 41 and the fourth selecting means 43.

According to the above-described method for controlling the laser light generator control circuit and laser diode of this embodiment, control pertaining to the optical output power and extinction ratio of the laser light generator is performed. During this control, the peak of the output signal of the monitor light receiving element is not detected and the temperature of the laser light generator is not monitored. The detection of this peak becomes problematic as the transmission rate increases. Also, temperature monitoring of the laser light generator, which becomes meaningless as the semiconductor light emitting element of the laser light generator alters with age, is not performed. Further, because monitoring of the temperature is not performed, miniaturization of the laser light generator can be implemented. In other words, a laser diode module such as a coaxial CAN module in which a laser light emitting element, a monitor photodiode, an optical system, and so forth form a module can be miniaturized.

With the method for controlling the laser light generator control circuit and laser diode illustrated by the present embodiment, it is possible to efficiently provide a circuit whereby the optical output power and extinction ratio are controlled so as to be fixed at a desired value with respect to changes with time and changes in the ambient temperature of the laser diode. That is, when optical transmitters are mass-produced, adjustment work suited to individual differences of laser diodes can be carried out efficiently. The light emission power and extinction ratio can be changed so as to be set to optional values.

The principles of the present invention have been described in the preferred embodiments. However, it can be seen by a person skilled in the art that the present invention permits changes to the configuration and details without departing from these principles. For example, the laser light generator control circuit illustrated by the embodiments is constituted by a bipolar transistor but could also be constituted by a compound semiconductor transistor of compounds from Groups III to V, or similar. The method for implementing the group of combinations is not restricted to the table described in these embodiments and may be changed according to requirements. In addition, in the embodiments, a control method that employed a group of combinations specified so that the optical output power and extinction ratio approach fixed values was described. However, the present invention also permits the application of a control method that employs a group of combinations specified so that the light emission power exhibits a predetermined dependence and the extinction ratio exhibits a predetermined dependence. Furthermore, although a case where the control section employs a processor such as a CPU was described in the embodiments, the control section could also be constituted by a digital logic circuit. Moreover, the laser light generator need not be one comprising a semiconductor laser element, but could instead comprise a semiconductor optical amplifier or be one in which an EA modulation element is integrated. Accordingly, rights to all corrections and modifications arising from the scope of the claims and of the spirit thereof are claimed here.

As described hereinabove, the present invention provides a laser light generator control circuit for exercising control relating to the optical output power and extinction ratio of a laser light generator comprising a semiconductor light emitting element, and provides a method for controlling a laser diode.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 2002-174554 filed on Jun. 14, 2002 is hereby incorporated by reference.

What is claimed is:

1. A control circuit for controlling a laser diode to emit light with a magnitude and an extinction ratio by supplying a bias current and a modulation current, the control circuit comprising:
    a load section for generating a signal that corresponds to an optical current generated by a light receiving element in accordance with the magnitude of the light emitted from the laser diode;
    a control section for
    selecting a combination of the bias and modulation currents based on a comparison of the signal with a reference value from a group of combinations, each combination including a pair of bias and modulation currents specified such that the light emitted from the laser diode exhibits a predetermined magnitude and the extinction ratio, and
    outputting a first and second control signals for controlling the bias and modulation currents, respectively, in accordance with the selected combination;
    a bias current circuit section for generating the bias current supplied to the laser diode in accordance with the first control signal, and
    a modulation current circuit section for generating the modulation current supplied to the laser diode in accordance with the second control signal.

2. The control circuit for the laser diode according to claim 1, wherein the control section comprises:
    first storing means for storing the group of combinations and the reference value;
    comparing means for comparing the signal generated by the load section with the reference value;
    first selecting means for selecting, from the group of combinations, a combination to increase the magnitude of the light when the comparison of the signal with the reference value indicates that the magnitude of the light is smaller than a predetermined value, and outputting the bias and modulation currents in the combination selected by the first selecting means as the first and second control signals, respectively; and
    second selecting means for selecting, from the group of combinations, a combination to reduce the magnitude of the light when the comparison between the signal with the reference value indicates that the magnitude of the light is greater than a predetermined value, and outputting the bias and modulation currents in the combination selected by the second selecting means as the first and second control signals, respectivaly.

3. The control circuit for the laser diode according to claim 2, wherein the control section comprises a second storing means for storing information corresponding to the first control signal and information corresponding to the second control signal.

4. The control circuit for the laser diode according to claim 2, wherein the first storing means is a nonvolatile storing means.

5. The control circuit for the laser diode according to claim 4, further comprising:
    an interface section for communicating with an external device; and
    means connected to the interface section and for writing in the nonvolatile storing means.

6. The control circuit for the laser diode according to claim 1, wherein the control section comprises:
    a first storing means for storing the group of combinations and the reference value;
    a comparing means for comparing the signal with the reference value;
    a first selecting means for selecting, from the group of combinations, a plurality of combinations that includes a combination to increase the magnitude of the light when the comparison of the signal with the reference value indicates that the magnitude of the light is smaller than a predetermined value, calculating the bias and modulation currents in accordance with the plurality of combinations selected by the first selecting means, and outputting the calculated bias and modulation currents as the first and second control signals, respectively; and
    a second selecting means for selecting, from the group of the combinations, a plurality of combinations that includes a combination to reduce the magnitude of the light when the comparison of the signal with the reference value indicates that the magnitude of the light is greater than a predetermined value, calculating the bias and modulation currents in accordance with the plurality of combinations selected by the second selecting means, and outputting the calculated bias and modulation currents as the first and second control signals, respectively.

7. The control circuit for the laser diode according to claim 1, further comprising:
    an interface section for communicating with an external device;

a means for interrupting the light emission of the laser diode by responding to an interrupt signal provided from the interface section; and a means for starting the light emission of the laser diode by responding to a start-up signal provided from the interface section.

8. The control circuit for the laser diode according to claim 1, wherein the control section comprises:

an A/D conversion circuit section for receiving the load voltage and generating a digital value corresponding to the load voltage;

a first D/A conversion circuit section for generating an analog value corresponding to the first control signal; and a second D/A conversion circuit section for generating an analog value corresponding to the second control signal.

9. The control circuit for the laser diode according to claim 1, wherein the control section comprises:

a means for holding the first and second control signals in a case when a difference between the signal and the reference value is equal to or lees than a threshold value.

10. The control circuit for the laser diode according to claim 1, wherein the control section comprises:

a means for generating the first and second control signals such that, in at least one of cases when the first control signal indicates an excessively large bias current, and when the second control signal indicates an excessively large modulation current, the bias and modulation currents are not increased.

11. The control circuit for the laser diode according to claim 1, wherein the control section comprises:

a means for generating the first and second control signals such that, in at least one of cases when the first control signal indicates an excessively small bias current, and when the second control signal indicates an excessively small modulation current, the bias and modulation currents are not reduced.

12. The control circuit for the laser diode according to claim 1, wherein the control section further comprises:

an initial value setting means for starting the control circuit by selecting a combination of the bias current and the modulation current to increase the bias and modulation currents from the group of combinations.

13. The control circuit for the laser diode according to claim 1, wherein the control section comprises:

a means for comparing any one of the first control signal, the second control signal, and the sum of the first and second control signals with a threshold value to generate a comparison signal that indicates an overcurrent and a normal current;

a means for generating, in a case when the comparison signal indicates the overcurrent, a warning signal indicating that the laser diode is in the overcurrent; and a means for interrupting the warning signal when the comparison signal indicates the normal current.

14. The control circuit for the laser diode according to claim 1, wherein the control section comprises:

a means for comparing the signal with a threshold value to generate a comparison signal that indicates a power shortage and normal power;

a means for generating a warning signal that indicates a drop in the magnitude of the light in a case when the comparison signal indicates the power shortage; and a means for interrupting the warning signal when the comparison signal indicates the normal power.

15. A method for controlling a laser diode that emits light with a magnitude and an extinction ratio by supplying a bias current and modulation current, the method comprising steps of:

(a) generating a signal that corresponds to an optical current generated by a light receiving element in accordance with the magnitude of light emitted from the laser diode;

(b) selecting a combination of the bias and modulation currents in accordance with a comparison of the signal with a reference value from a group of combinations, each combination including a pair of bias and modulation currents specified such that the light emitted from the laser diode exhibits a predetermined magnitude and the extinction ratio; and (c) generating a first and second control signals for controlling the bias and modulation currents, respectively, in accordance with the combination selected from the group of combinations; and (d) generating the bias and the modulation currents in accordance with the first and second control signals, respectively.

16. The method for controlling the laser diode according to claim 15, wherein the step (c) for generating first and second control signals further comprises steps of:

comparing the signal with the reference value; and selecting a combination of bias and modulation currents from the group of combinations to increase the magnitude of the light when the comparison of the signal with the reference value indicates that the magnitude of the light is smaller than a predetermined value, and outputting the bias and modulation currents defined by the combination selected from the group of combinations as the first and second control signals, respectively; and selecting a combination of the bias and modulation currents from the group of combinations to reduce the magnitude of the light when the comparison of the signal with the reference value indicates that the magnitude of the light is greater than a predetermined value, and outputting the bias and modulation currents defined in the combination selected from the group of combinations as the first and second control signals, respectively.

17. The method for control the laser diode according to claim 15, wherein the step (c) for generating first and second control signals further comprises steps of:

comparing a signal with the reference value;

selecting, from the group of combinations, a plurality of combinations including a combination to increase the magnitude of the light when the comparison of the signal with the reference value indicates that the magnitude of the light is smaller than a predetermined value, calculating the bias and modulation currents based on the plurality of combinations selected from the group of the combinations, and outputting the calculated bias and modulation currents as the first and second control signals, respectively; and selecting, from the group of combinations, a plurality of combinations including a combination to reduce the magnitude of the light when the comparison of the signal with the reference value indicates that the magnitude of the light is greater than a predetermined value, calculating the bias and modulation currents based on the plurality of combinations selected from the group of combinations, and outputting the calculated bias and modulation currents as the first and second control signals, respectively.

* * * * *